United States Patent
Xu et al.

(10) Patent No.: US 11,218,177 B2
(45) Date of Patent: Jan. 4, 2022

(54) RATE MATCHING FOR BLOCK ENCODING

(71) Applicant: QUALCOMM Incorporated, San Diego, CA (US)

(72) Inventors: Changlong Xu, Beijing (CN); Jian Li, Beijing (CN); Chao Wei, Beijing (CN); Jilei Hou, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 96 days.

(21) Appl. No.: 16/317,395

(22) PCT Filed: Jun. 12, 2017

(86) PCT No.: PCT/CN2017/087888
§ 371 (c)(1),
(2) Date: Jan. 11, 2019

(87) PCT Pub. No.: WO2018/028294
PCT Pub. Date: Feb. 15, 2018

(65) Prior Publication Data
US 2019/0296776 A1   Sep. 26, 2019

(30) Foreign Application Priority Data
Aug. 10, 2016  (WO) ................ PCT/CN2016/094374

(51) Int. Cl.
*H03M 13/00* (2006.01)
*H03M 13/13* (2006.01)
*H03M 11/26* (2006.01)

(52) U.S. Cl.
CPC ....... *H03M 13/6356* (2013.01); *H03M 13/13* (2013.01); *H03M 13/6362* (2013.01)

(58) Field of Classification Search
None
See application file for complete search history.

(56) References Cited

U.S. PATENT DOCUMENTS

| 6,625,234 B1 * | 9/2003 | Cui ................... H03M 13/2703 |
| | | 375/341 |
| 2002/0015420 A1 * | 2/2002 | Yoon .................... H04L 1/0071 |
| | | 370/468 |

(Continued)

FOREIGN PATENT DOCUMENTS

| CN | 101192878 A * | 6/2008 |
| CN | 101192878 A | 6/2008 |

(Continued)

OTHER PUBLICATIONS

International Search Report and Written Opinion—PCT/CN2016/094374—ISA/EPO—dated Apr. 27, 2017.
International Search Report and Written Opinion—PCT/CN2017/087888—ISA/EPO—dated Aug. 30, 2017.

(Continued)

*Primary Examiner* — Cynthia Britt
*Assistant Examiner* — Dipakkumar B Gandhi
(74) *Attorney, Agent, or Firm* — Qualcomm Incorporated

(57) ABSTRACT

Various aspects of the disclosure relate to rate matching techniques for block encoding. In some aspects, a decision regarding whether to use repetition-based rate matching or puncture-based rate matching is made based on a block size of information being encoded. In some aspects, repetition-based rate matching uses a bit-reversal permutation technique.

41 Claims, 16 Drawing Sheets

(56) References Cited

U.S. PATENT DOCUMENTS

| | | | | |
|---|---|---|---|---|
| 2002/0071395 | A1* | 6/2002 | Redi | H04L 45/00 370/252 |
| 2003/0133497 | A1 | 7/2003 | Kinjo et al. | |
| 2012/0008555 | A1* | 1/2012 | Zhang | H04L 5/0062 370/328 |
| 2013/0223485 | A1 | 8/2013 | Bai et al. | |
| 2014/0040214 | A1* | 2/2014 | Ma | H03M 7/30 707/693 |
| 2016/0182187 | A1* | 6/2016 | Kim | H04L 1/1861 714/807 |

FOREIGN PATENT DOCUMENTS

| | | |
|---|---|---|
| CN | 101488833 A | 7/2009 |
| CN | 105049061 A | 11/2015 |
| EP | 1176725 A2 | 1/2002 |
| EP | 1672825 A2 | 6/2006 |
| WO | 2015139297 A1 | 9/2015 |

OTHER PUBLICATIONS

Chen K., et al., "A Hybrid ARQ Scheme based on Polar Codes", IEEE Communications Letters, IEEE Service Center, Piscataway, NJ, US, vol. 17, No. 10, Oct. 1, 2013 (Oct. 1, 2013), pp. 1996-1999, XP011535616, ISSN: 1089-7798, DOI: 10.1109/LCOMM.2013. 090213.131670 [retrieved on Oct. 28, 2013] the whole document.
European Search Report—EP20175041—Search Authority—Munich—dated Aug. 19, 2020.
LG Electronics: "Discussions on Polar Code Design", 3GPP TSG RAN WG1 Meeting #85, 3GPP Draft; R1-164565_Discussions on Polar Code Design Final, 3rd Generation Partnership-Project (3GPP), Mobile Competence Centre; 650, Route Des Lucioles; F-06921 Sophia-Antipolis Cedex; France, vol. RAN WG1. No. Nanjing. China; May 23, 2016-May 27, 2016, May 14, 2016 (May 14, 2016), 5 Pages, XP051089956, Retrieved from the Internet: URL: http://www.3gpp.org/ftp/tsg_ran/WG1_RL1/TSGR1_85/Docs/ [retrieved on May 14, 2016] pp. 2,3.
Supplementary Partial European Search Report—EP17838426—Search Authority—Munich—dated Jun. 3, 2020.

* cited by examiner

RATE MATCHING FOR BLOCK ENCODING

CROSS-REFERENCE TO RELATED APPLICATION(S)

This application is the U.S. national stage of PCT patent application number PCT/CN2017/087888 filed on Jun. 12, 2017 which is a continuation-in-part of and claims priority to and the benefit of PCT patent application number PCT/CN2016/094374 filed on Aug. 10, 2016, the entire content of which is incorporated herein by reference.

INTRODUCTION

Various aspects described herein relate to wireless communication, and more particularly but not exclusively, to rate matching techniques for block encoding.

A wireless communication system may use error correcting codes to facilitate reliable transmission of digital messages over noisy channels. A block code is one type of error correcting code. In a typical block code, an information message or sequence is split up into blocks, and an encoder at the transmitting device mathematically adds redundancy to the information message. Exploitation of this redundancy in the encoded information message improves the reliability of the message, enabling correction for bit errors that may occur due to the noise. That is, a decoder at the receiving device can take advantage of the redundancy to reliably recover the information message even though bit errors may occur, in part, due to the addition of noise by the channel.

Examples of error correcting block codes include Hamming codes, Bose-Chaudhuri-Hocquenghem (BCH) codes, and turbo codes among others. Many existing wireless communication networks utilize such block codes, such as 3GPP LTE networks, which utilize turbo codes, and IEEE 802.11n Wi-Fi networks.

In practice, the size of resource elements used to convey (e.g., transmit) encoded data might not match the block size of a block code. This can negatively impact decoding complexity and/or performance. Accordingly, there is a need for efficient techniques for block coding information.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

In one aspect, the disclosure provides an apparatus configured for communication that includes a memory and a processor coupled to the memory. The processor and the memory are configured to: receive information to be encoded; determine a code block size for the received information; select rate matching for encoding the received information, wherein the selection is between repetition-based rate matching and puncture-based rate matching, and wherein the selection is based on the code block size; and block encode the received information using the selected rate matching.

Another aspect of the disclosure provides a method for communication including: receiving information to be encoded; determining a code block size for the received information; selecting rate matching for encoding the received information, wherein the selection is between repetition-based rate matching and puncture-based rate matching, and wherein the selection is based on the code block size; and block encoding the received information using the selected rate matching.

Another aspect of the disclosure provides an apparatus configured for communication. The apparatus including: means for receiving information to be encoded; means for determining a code block size for the received information; means for selecting rate matching for encoding the received information, wherein the selection is between repetition-based rate matching and puncture-based rate matching, and wherein the selection is based on the code block size; and means for block encoding the received information using the selected rate matching.

Another aspect of the disclosure provides a non-transitory computer-readable medium storing computer-executable code, including code to: receive information to be encoded; determine a code block size for the received information; select rate matching for encoding the received information, wherein the selection is between repetition-based rate matching and puncture-based rate matching, and wherein the selection is based on the code block size; and block encode the received information using the selected rate matching.

In one aspect, the disclosure provides an apparatus configured for communication that includes a memory and a processor coupled to the memory. The processor and the memory are configured to: receive information to be encoded; block encode the received information to generate first block coded data; generate a repetition pattern; obtain coded bits based on the repetition pattern; and generate second block coded data by adding the coded bits to the first block coded data.

Another aspect of the disclosure provides a method for communication including: receiving information to be encoded; block encoding the received information to generate first block coded data; generating a repetition pattern; obtaining coded bits based on the repetition pattern; and generating second block coded data by adding the coded bits to the first block coded data.

Another aspect of the disclosure provides an apparatus configured for communication. The apparatus including: means for receiving information to be encoded; means for block encoding the received information to generate first block coded data; means for generating a repetition pattern; means for obtaining coded bits based on the repetition pattern; and means for generating second block coded data by adding the coded bits to the first block coded data.

Another aspect of the disclosure provides a non-transitory computer-readable medium storing computer-executable code, including code to: receive information to be encoded; block encode the received information to generate first block coded data; generate a repetition pattern; obtain coded bits based on the repetition pattern; and generate second block coded data by adding the coded bits to the first block coded data.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

The accompanying drawings are presented to aid in the description of aspects of the disclosure and are provided solely for illustration of the aspects and not limitations thereof.

DETAILED DESCRIPTION

Figure 1:
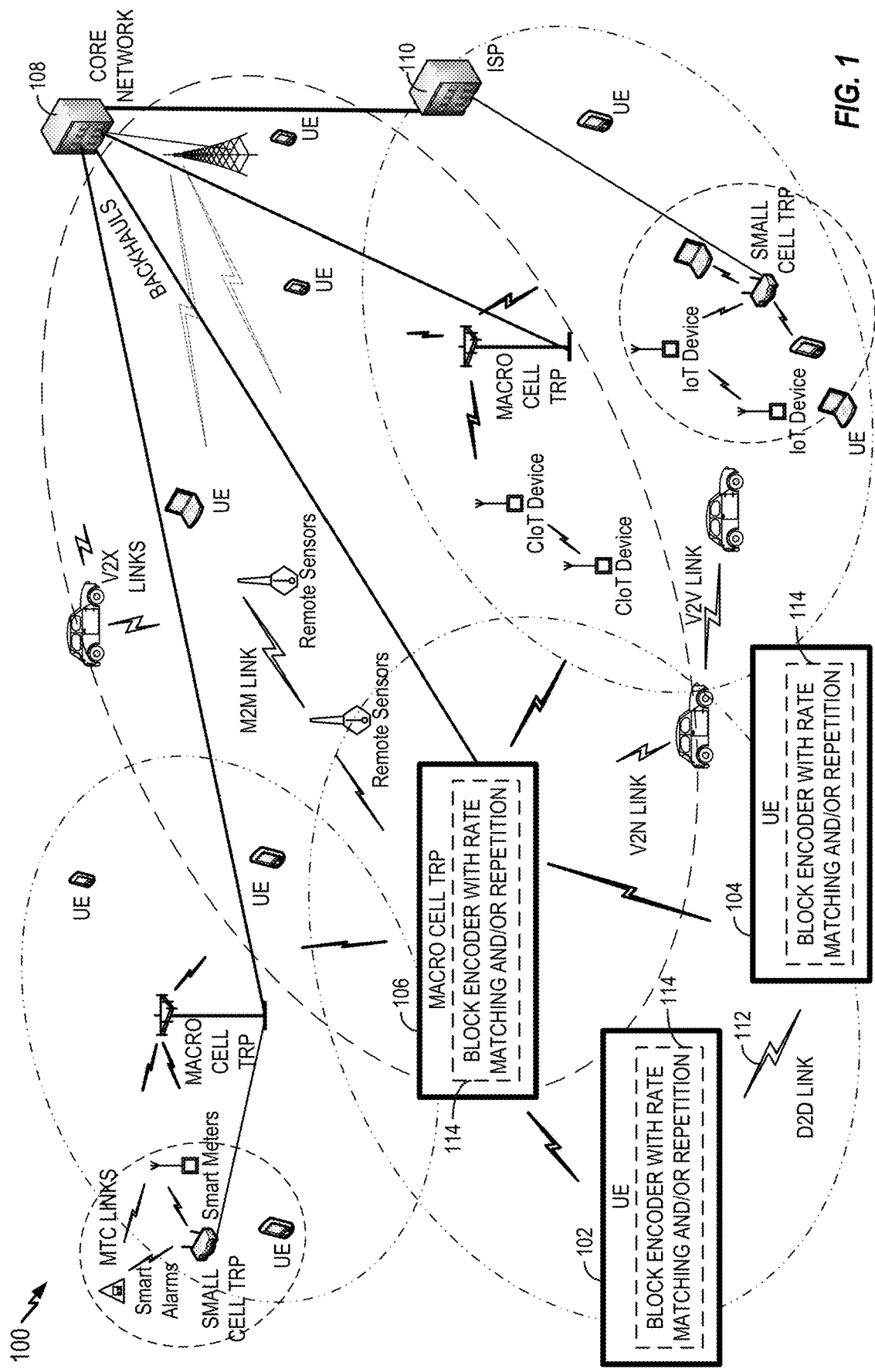
FIG. 1 is a block diagram of an example communication system in which aspects of the disclosure may be used.

Various aspects of the disclosure relate to rate matching techniques for a block encoder. In some aspects, a decision regarding whether to use repetition-based rate matching or puncture-based rate matching for the encoding is made based on a block size of information being encoded. For example, repetition-based rate matching may be used if the number of repetition bits is relatively small. Otherwise, puncture-based rate matching may be used. Also, in some aspects, repetition-based rate matching for encoding may use a bit-reversal permutation technique.

In some implementations, a block encoder as taught herein may use Polar codes. For example, Polar codes may be used for 5G channel coding.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. Moreover, alternate configurations may be devised without departing from the scope of the disclosure. Additionally, well-known elements will not be described in detail or will be omitted so as not to obscure the relevant details of the disclosure.

The various concepts presented throughout this disclosure may be implemented across a broad variety of telecommunication systems, network architectures, and communication standards. For example, the 3rd Generation Partnership Project (3GPP) is a standards body that defines several wireless communication standards for networks involving the evolved packet system (EPS), frequently referred to as long-term evolution (LTE) networks. Evolved versions of the LTE network, such as a fifth-generation (5G) network, may provide for many different types of services or applications, including but not limited to web browsing, video streaming, VoIP, mission critical applications, multi-hop networks, remote operations with real-time feedback (e.g., tele-surgery), etc. Thus, the teachings herein can be implemented according to various network technologies including, without limitation, 5G technology, fourth generation (4G) technology, third generation (3G) technology, and other network architectures. Also, the techniques described herein may be used for a downlink, an uplink, a peer-to-peer link, or some other type of link.

The actual telecommunication standard, network architecture, and/or communication standard used will depend on the specific application and the overall design constraints imposed on the system. For purposes of illustration, the following may describe various aspects in the context of a 5G system and/or an LTE system. It should be appreciated, however, that the teachings herein may be used in other systems as well. Thus, references to functionality in the context of 5G and/or LTE terminology should be understood to be equally applicable to other types of technology, networks, components, signaling, and so on.

Example Communication System

FIG. 1 illustrates an example of a wireless communication system 100 where a user equipment (UE) can communicate with other devices via wireless communication signaling. For example, a first UE 102 and a second UE 104 may communicate with a transmit receive point (TRP) 106 using wireless communication resources managed by the TRP 106 and/or other network components (e.g., a core network 108, an internet service provider (ISP) 110, and so on). In some implementations, one or more of the components of the system 100 may communicate with each other directedly via a device-to-device (D2D) link 112 or some other similar type of direct link.

Communication of information between two or more of the components of the system 100 may involve encoding the information. For example, the TRP 106 may encode data or control information that the TRP 106 sends to the UE 102 or the UE 104. As another example, the UE 102 may encode data or control information that the UE 102 sends to the TRP 106 or the UE 104. The encoding may involve block coding such as Polar coding. In accordance with the teachings herein, one or more of the UE 102, the UE 104, the TRP 106, or some other component of the system 100 may include a block encoder with rate matching and/or repetition 114.

The components and links of the wireless communication system 100 may take different forms in different implementations. For example, and without limitation, UEs may be cellular devices, Internet of Things (IoT) devices, cellular IoT (CIoT) devices, LTE wireless cellular devices, machine-type communication (MTC) cellular devices, smart alarms, remote sensors, smart phones, mobile phones, smart meters, personal digital assistants (PDAs), personal computers, mesh nodes, and tablet computers.

In some aspects, a TRP may refer to a physical entity that incorporates radio head functionality for a particular physical cell. In some aspects, the TRP may include 5G new radio (NR) functionality with an air interface based on orthogonal frequency division multiplexing (OFDM). NR may support, for example and without limitation, enhanced mobile broadband (eMBB), mission-critical services, and wide-scale deployment of IoT devices. The functionality of a TRP may be similar in one or more aspects to (or incorporated into) the functionality of a CIoT base station (C-BS), a NodeB, an evolved NodeB (eNodeB), radio access network (RAN) access node, a radio network controller (RNC), a base station (BS), a radio base station (RBS), a base station controller (BSC), a base transceiver station (BTS), a transceiver function (TF), a radio transceiver, a radio router, a basic service set (BSS), an extended service set (ESS), a macro cell, a macro node, a Home eNB (HeNB), a femto cell, a femto node, a pico node, or some other suitable entity. In different scenarios (e.g., NR, LTE, etc.), a TRP may be referred to as a gNodeB (gNB), an eNB, a base station, or referenced using other terminology.

Various types of network-to-device links and D2D links may be supported in the wireless communication system 100. For example, D2D links may include, without limitation, machine-to-machine (M2M) links, MTC links, vehicle-to-vehicle (V2V) links, and vehicle-to-anything (V2X) links Network-to-device links may include, without limitation, uplinks (or reverse links), downlinks (or forward links), and vehicle-to-network (V2N) links.

Example Communication Components

Figure 2:
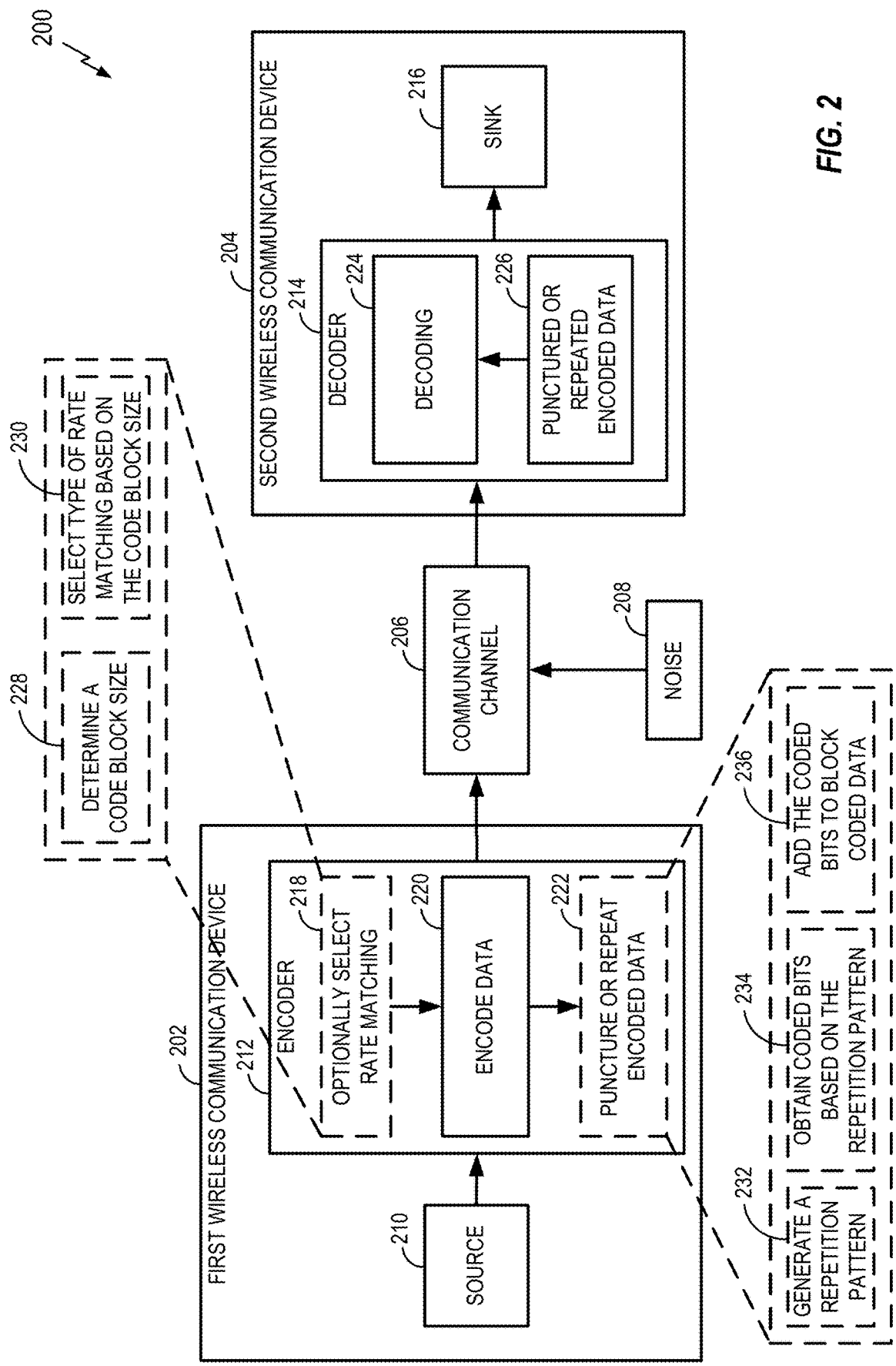
FIG. 2 is a block diagram of example communication devices in which aspects of the disclosure may be used.

FIG. 2 is a schematic illustration of a wireless communication system 200 that includes a first wireless communication device 202 and a second wireless communication device 204 that may use the teachings herein. In some implementations, the first wireless communication device 202 or the second wireless communication device 204 may correspond to the UE 102, the UE 104, or the TRP 106 of FIG. 1.

In the illustrated example, the first wireless communication device 202 transmits a message over a communication channel 206 (e.g., a wireless channel) to the second wireless communication device 204. One issue in such a scheme that must be addressed to provide for reliable communication of the digital message, is to take into account noise 208 that affects the communication channel 206.

Block codes or error correcting codes are frequently used to provide reliable transmission of messages over noisy channels. In a typical block code, an information message or sequence from an information source 210 at the first (transmitting) wireless communication device 202 is split up into blocks, each block having a length of K bits. An encoder 212 mathematically adds redundancy to the information message, resulting in codewords having a length of N, where N>K. Here, the code rate R is the ratio between the message length and the block length (i.e., R=K/N). Exploitation of this redundancy in the encoded information message is a key to reliably receiving the transmitted message at the second (receiving) wireless communication device 204, whereby the redundancy enables correction for bit errors that may occur due to the noise 208 imparted on the transmitted message. That is, a decoder 214 at the second (receiving) wireless communication device 204 can take advantage of the redundancy to reliably recover the information message provided to an information sink 216 even though bit errors may occur, in part, due to the addition of the 208 noise to the channel 206.

Many examples of such error correcting block codes are known to those of ordinary skill in the art, including Hamming codes, Bose-Chaudhuri-Hocquenghem (BCH) codes, and turbo codes, among others. Some existing wireless communication networks utilize such block codes. For example, 3GPP LTE networks may use turbo codes. However, for future networks, a new category of block codes, called Polar codes, presents a potential opportunity for reliable and efficient information transfer with improved performance relative to other codes.

Polar codes are linear block error correcting codes where channel polarization is generated with a recursive algorithm that defines Polar codes. Polar codes are the first explicit codes that achieve the channel capacity of symmetric binary-input discrete memoryless channels. That is, Polar codes achieve the channel capacity (the Shannon limit) or the theoretical upper bound on the amount of error-free information that can be transmitted on a discrete memoryless channel of a given bandwidth in the presence of noise. This capacity can be achieved with a simple successive cancellation (SC) decoder.

Polar codes may be considered as block codes (N, K) where N is the code block size and K is the number of information bits. The number of information bits K is variable. While it would be flexible for the encoder 212 to be able to select the number of information bits K, with Polar codes, the codeword length N is a power-of-two (e.g., 256, 512, 1024, etc.) because the original construction of a polarizing matrix is based on the Kronecker product of $$\begin{bmatrix} 1 & 0 \\ 1 & 1 \end{bmatrix}.$$

The disclosure relates in some aspects to rate matching for Polar codes to support a variable block size of the input data and the power-of-two block size for Polar coding. In other words, to support the variable size of resources in a practical system, the block size used with Polar coding may be adapted to the resource size.

Puncturing is one technique that can be used to obtain a codeword that has a block size that is not a power-of-two from a codeword that has a block size that is a power-of-two. As used herein, the term puncturing may refer to, for example, reducing the size of a block by omitting (e.g., eliminating) some of the bits of the original block, while the term repetition may refer to, for example, increasing the size of a block by repeating (e.g., adding) some of the bits of the original block. In practice, it may be impractical to do an exhaustive search for an optimal puncture pattern due to the relatively large computation complexity involved in such a search. Consequently, uniform puncturing may be used instead.

For Polar codes, the performance with puncturing half of the coded bits is the same as the performance for the code with half the length of the original coded bits. However, the latter has half the decoding complexity of the former. This implies that the puncture scheme is not efficient when the number of puncture bits is close to half of the original coded bits. In this case, the decoding complexity of puncturing is the same as the original code with very small performance gain.

In accordance with the teaching herein, repetition may be used instead of puncturing to obtain a codeword that has a block size that is not a power-of-two from a codeword that has a block size that is a power-of-two. In some aspects, repetition may provide a desired tradeoff between decoding complexity and performance when the number of the puncture bits would be close to (or less than) half of the original bits. In this case, the decoding complexity of the repetition is half of the original code with very marginal performance degradation compared to a uniform puncture scheme.

Referring again to FIG. 2, to generate encoded data for a first transmission, the encoder 212 may include functionality to select rate matching 218 and functionality to encode data 220 (e.g., to generate a codeword). In some aspects, the functionality to select rate matching 218 selects the type of rate matching to be used (e.g., repetition or puncturing) depending on the block size used by the encoding. To this end, the functionality to select rate matching 218 may include functionality to determine a code block size 228 and functionality to select a type of rate matching based on the code block size.

The encoder 212 punctures or repeats the encoded data (e.g., a codeword) using a puncture pattern or repetition pattern, respectively, and sends the resulting data over the communication channel 206. To this end, the encoder 212 may include functionality to puncture or repeat encoded data 222. For a repetition operation, the functionality to puncture or repeat encoded data 222 may include functionality to generate a repetition pattern 232, functionality to obtain coded bits based on the repetition pattern 234, and functionality to add the coded bits to block coded data 236.

Upon receiving the punctured or repeated encoded data 226, the decoder 214 of the second wireless communication device 204 decodes the data 226. For example, the decoder 214 may use decoding 224 such as SC decoding or some other suitable type of decoding.

Rate Matching Selection

Figure 3:
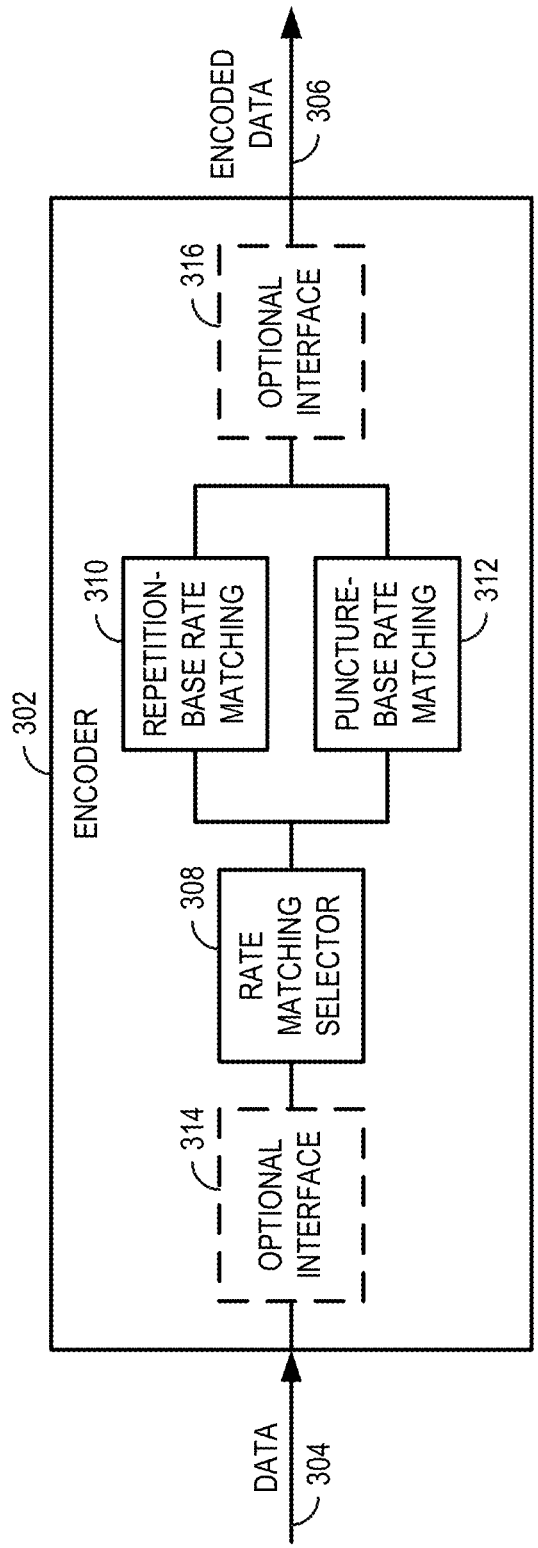
FIG. 3 is a block diagram of an example encoder in accordance with some aspects of the disclosure.

The disclosure relates in some aspects to an efficient rate-matching process that provides an acceptable tradeoff between decoding complexity and performance. Referring to FIG. 3, a block encoder 302 (e.g., an encoder using Polar coding) encodes data 304 to generate encoded data 306. In accordance with the teachings herein, a rate matching selector 308 selects a rate matching scheme to be used to encode the data 304. In some aspects, this selection may be based on a code block size associated with the data 304 (e.g., based on the characteristics of a resource that will be used to communicate the encoded data 306). As discussed in more detail below, in some cases (e.g., when the number of repetition bits is relatively small), repetition-based rate matching 310 is used for the encoding; while in other cases, puncture-based rate matching 312 is used for the encoding.

In some implementations, the encoder 302 may include an interface 314, an interface 316, or both. An interface may include, for example, an interface bus, bus drivers, bus receivers, other suitable circuitry, or a combination thereof. For example, the interface 314 may include receiver devices, buffers, or other circuitry for receiving a signal. As another example, the interface 316 may include output devices, drivers, or other circuitry for sending a signal. In some implementations, the interfaces 314 and 316 may be configured to interface one or more other components of the encoder 302 (other components not shown in FIG. 3).

The encoder 302 may take different forms in different implementations. In some cases, the encoder 302 may be an integrated circuit. In some cases, the encoder 302 may be included in an integrated circuit that includes other circuitry (e.g., a processor and related circuitry).

Example Rate Matching Scheme for Polar Codes

For purposes of illustration, an example of a rate matching scheme in accordance with the teachings herein will now be described in the context of Polar codes. It should be appreciated, however, that the techniques described herein may be applicable to other types of coding as well.

Figure 4:
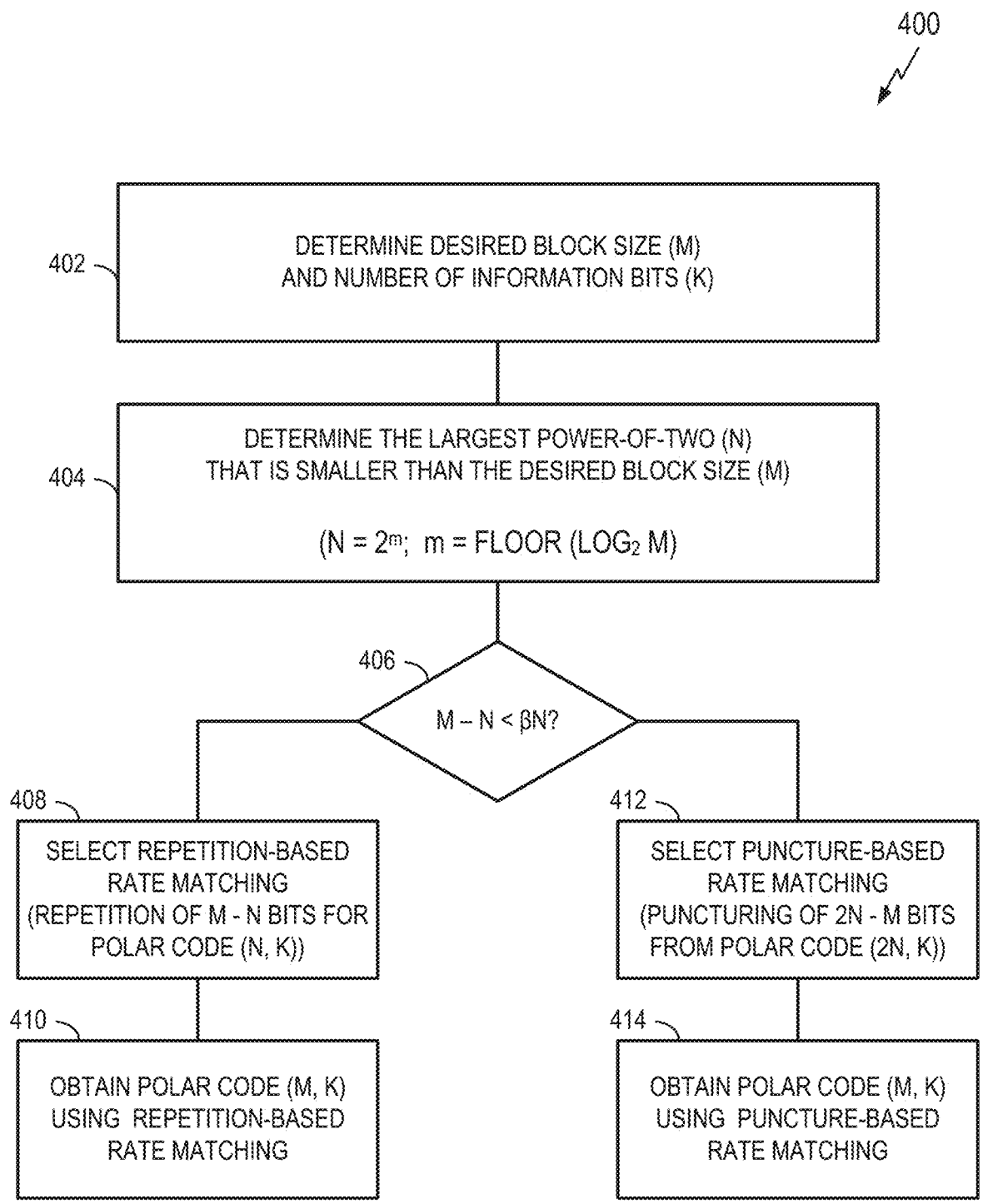
FIG. 4 is a flow diagram of an example coding process in accordance with some aspects of the disclosure.

FIG. 4 illustrates an example of a rate matching process 400 for Polar codes. The process 400 may be performed, for example, by the encoder 302 of FIG. 3 or the apparatus 900 of FIG. 9.

At block 402, a desired coded block size (M) and the number of information bits (K) for data to be coded are determined. At block 404, a parameter (N) is determined. N is the biggest power-of-two integer that is less than M, that is, $N \le M \le 2N$. This calculation may be based on the parameter $m = \text{floor}(\log_2 M)$ and $N = 2^m$.

In some aspects, there may be two ways to construct Polar codes (M, K) for the case where the block size is not a power-of-two. The first technique involves puncturing 2N−M bits from the Polar code (2N, K). The second technique involves repeating M−N bits for the Polar code (N, K). The decoding complexity of the former is double of the latter. In addition, the performance gain reduces with an increase in the number of puncture bits. For example, the performance of the Polar code (2N, K) with N puncture bits is the same as that of the Polar code (N, K); however, the decoding complexity with puncture is twice as high. To obtain a desired tradeoff between decoding complexity and performance gain, repetition is a preferable choice if the number of puncture bits (2N−M) is close to N. Stated another way, repetition is a preferable choice if repetition bits of M−N is small.

In some implementations, a threshold may be used to decide whether to use puncture or repetition. A parameter β (e.g., a fraction) may be used to express such a threshold. At block 406 of FIG. 4, if M−N<βN (e.g., with β<0.5), for repetition-based rate matching is selected (blocks 408 and 410). Otherwise, puncture-based rate matching is selected (blocks 412 and 414).

Figure 6:
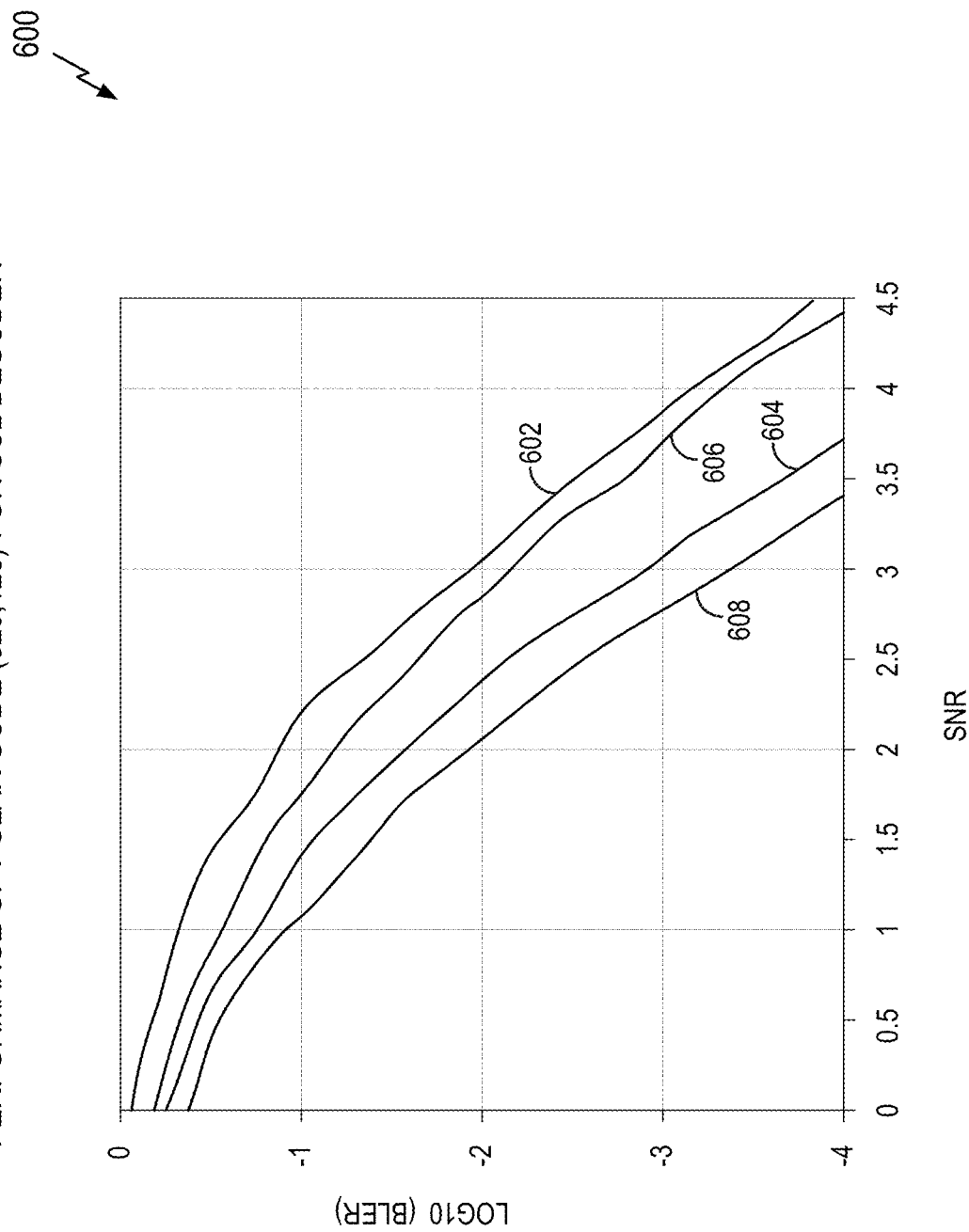
FIG. 6 is a graph of a first example simulation in accordance with some aspects of the disclosure.
Figure 7:
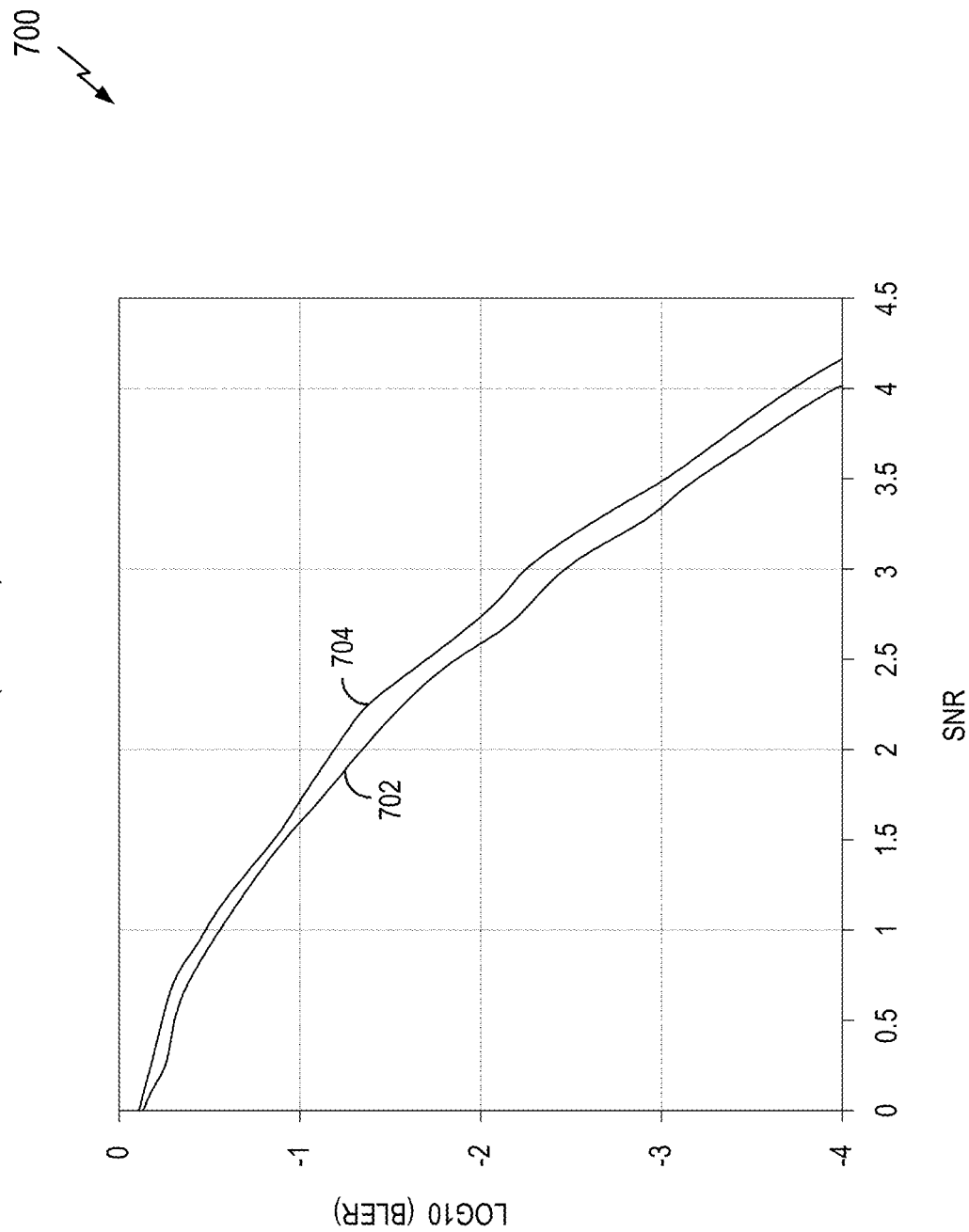
FIG. 7 is a graph of a second example simulation in accordance with some aspects of the disclosure.
Figure 8:
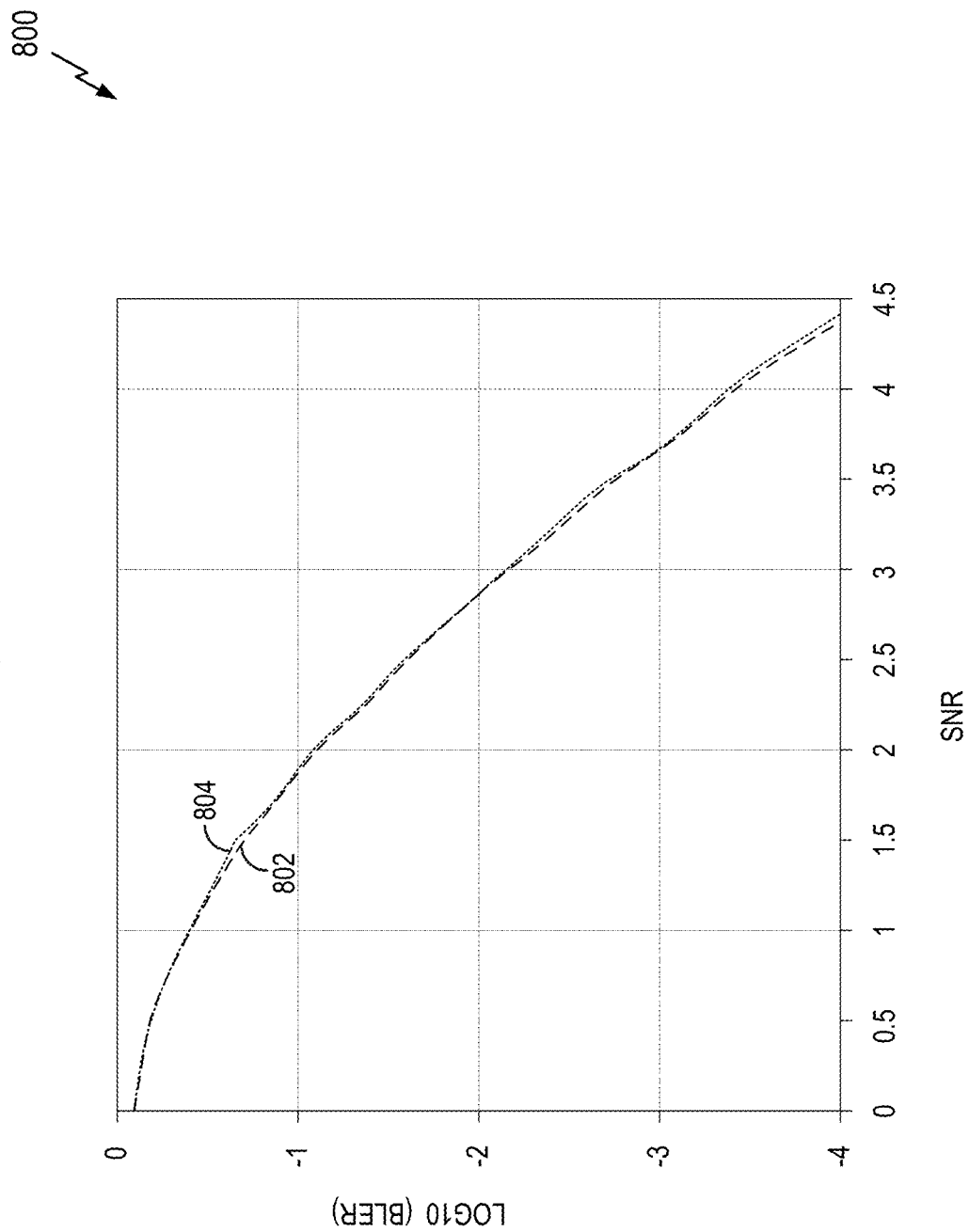
FIG. 8 is a graph of a third example simulation in accordance with some aspects of the disclosure.

The value of β can be optimized using simulation, empirical testing, or other suitable techniques. The performance gap between puncture from Polar code (2N, K) and repetition for Polar code (N, K) becomes large with an increase of β. The example simulation results of FIGS. 6-8 show that a good tradeoff can be obtained when the value of β is less than ⅛. The value of β may be selected as a design choice depending on the needs of a given implementation. For example, there may be tradeoffs between performance and circuit complexity. Accordingly, in some cases, a lower value of β may be selected to provide high performance while, in other cases, a higher value of β may be selected to reduce the complexity of the encoder circuitry.

Example Repetition Scheme

For purposes of illustration, an example of a repetition scheme in accordance with the teachings herein will now be described in the context of Polar codes. It should be appreciated, however, that the techniques described herein may be applicable to other types of coding as well.

Figure 5:
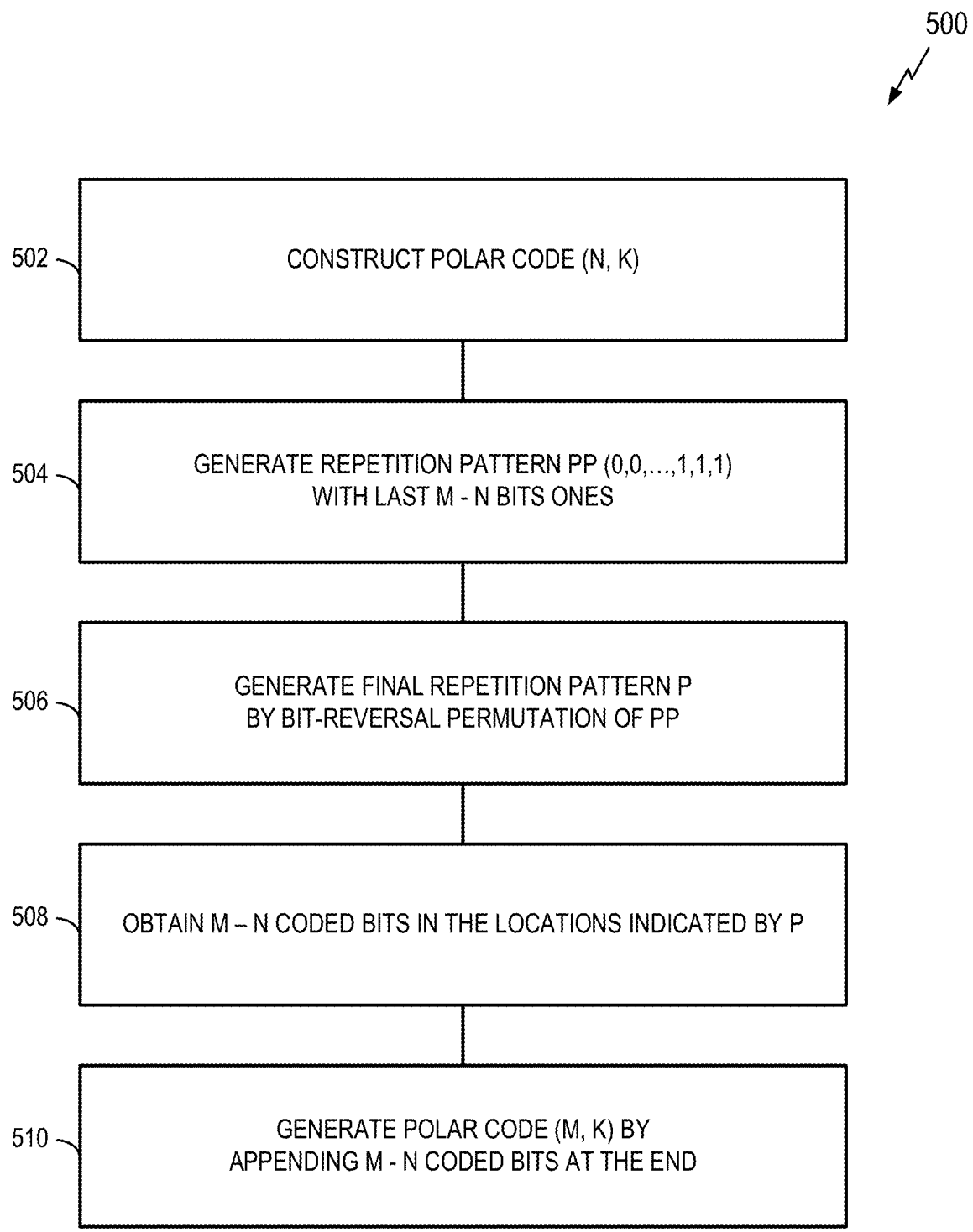
FIG. 5 is a flow diagram of an example repetition-based process in accordance with some aspects of the disclosure.

FIG. 5 illustrates an example of a repetition process 500 for Polar codes. The process 500 may be performed, for example, by the encoder 302 of FIG. 3 or the apparatus 1300 of FIG. 13.

At block 502, a Polar code (N, K) is constructed thereby obtaining N coded bits. At block 504, a repetition pattern PP=(0, 0, 0, . . . , 1, 1, 1)$_M$ is generated. The last M−N bits of this pattern are ones. At block 506, the final repetition pattern P will be the bit-reversal permutation of PP. The final repetition pattern P may be close to a uniform repetition. At block 508, repetition bits are obtained by collecting the bits whose locations correspond to ones in the pattern P. At block 510 the Polar code (M, K) is generated by appending the M−N coded bits at the end of the Polar code (N, K).

Example Puncture Schemes

As discussed above, puncturing may be used to obtain length-compatible Polar codes having a codeword whose block length is not a power-of-two. For example, to obtain a 1000-bit codeword length, 24 bits may be punctured from a 1024-bit codeword. According to various aspects of the present disclosure, puncturing may be utilized to obtain codewords of arbitrary length (e.g., lengths that are not necessarily a power-of-two). Thus, in general, the term puncturing as used herein may refer, at least in some aspects, to removing one or more coded bits from a set of coded bits (e.g., a codeword).

When performing codeword puncturing, the selection of which bits to puncture (the puncturing pattern) is an important concern and can affect the efficiency of the algorithm. Even if it is possible, it might not be desirable to perform an exhaustive search of all puncture patterns to find the optimal puncture pattern, due to the extensive computation complexity that would be required.

A puncturing scheme may use various puncturing patterns. Among known puncturing patterns, a uniform puncturing pattern provides relatively good performance. It should be appreciated, however, that non-uniform (e.g., random) puncturing may be used in conjunction with the teachings herein.

Decoding

At a receiving device, coded information may be decoded using, for example, a decoder based on a successive cancellation decoding algorithm. In some aspects, a decoder could be based on (e.g., similar to) a decoder used for low-density parity-check (LDPC) codes or Turbo codes in terms of the input and the output of the decoder.

Example Simulations

FIGS. 6, 7, and 8 illustrate simulations 600, 700, and 800, respectively, for Polar codes with different values for β. In the simulations, Gaussian Approximation (GA) algorithm is used to construct Polar code. The number of the information bits K is 128 and N is 256 bits. The block sizes M are 320, 288 and 272 bits. These sizes correspond to ¼, ⅛, and 1/16 for β, respectively. A CRC aided list successive cancellation decoding algorithm is used with list size of 32.

The performance of Polar code (320,128) is depicted in FIG. 6. The puncture algorithm with bit-reversal permutation is applied for construction of Polar code. The legend of "original" (curve 602) stands for the performance of Polar code (256,128). Two repetition schemes are evaluated: a scheme based on bit-reversal permutation (curve 604) and a scheme based on block repetition (curve 606). In the latter, the first quarter of the block is repeated. The second quarter, the third quarter and the last quarter of the block for repetition may have similar performance. Therefore, only one curve here is shown. As indicated, the performance with puncture (curve 608) is best, albeit, with twice the complexity over the other schemes. The two repetition schemes outperform the original case because 64 coded bits are repeated. The repetition with bit-reversal permutation outperforms the block repetition. Considering around 0.4 dB gain over repetition, puncture may still be a good choice when β is larger than ¼.

The performance of Polar code (288,128) and (272,128) are depicted in FIG. 7 and FIG. 8, respectively. As indicated, the performance gap between puncture (curve 702 in FIG. 7 and curve 802 in FIG. 8) and repetition (curve 704 in FIG. 7 and curve 804 in FIG. 8) with bit-reversal permutation becomes smaller are β decreases. The gap is less than 0.2 dB when β equals to ⅛ in this example There is marginal gain when β equals to 1/16 in this example. Therefore, a good tradeoff between decoding complexity and performance may be obtained when β less than ⅛.

First Example Apparatus

Figure 9:
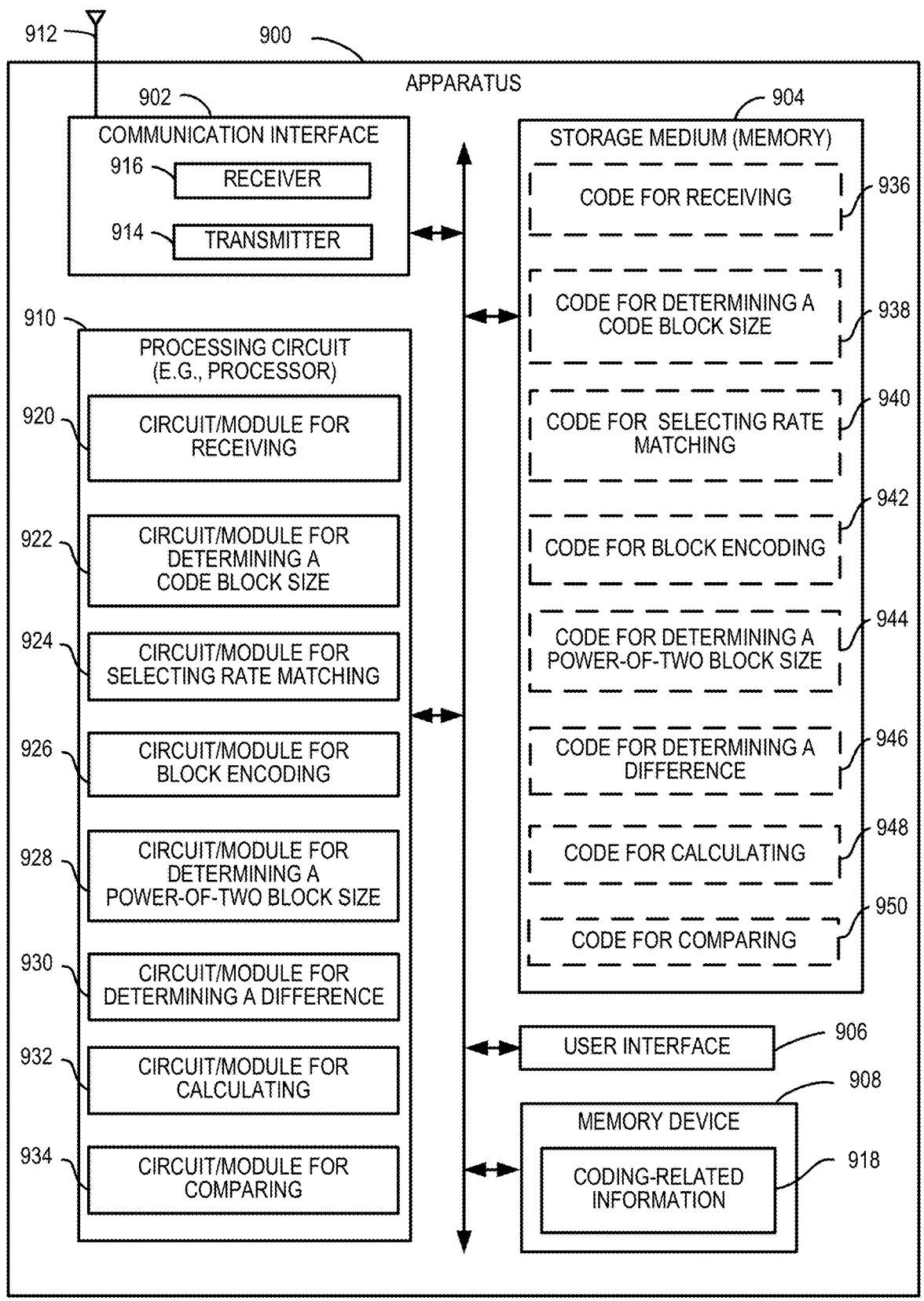
FIG. 9 is a block diagram illustrating an example hardware implementation for an apparatus (e.g., an electronic device) that can support encoding in accordance with some aspects of the disclosure.

FIG. 9 illustrates a block diagram of an example hardware implementation of an apparatus 900 configured to use encoding according to one or more aspects of the disclosure. The apparatus 900 could embody or be implemented within a UE, a transmit receive point (TRP), a base station, or some other type of device that supports encoding as taught herein. In various implementations, the apparatus 900 could embody or be implemented within an access terminal, an access point, or some other type of device. In various implementations, the apparatus 900 could embody or be implemented within a mobile phone, a smart phone, a tablet, a portable computer, a server, a network entity, a personal computer, a sensor, an alarm, a vehicle, a machine, an entertainment device, a medical device, or any other electronic device having circuitry.

The apparatus 900 includes a communication interface 902 (e.g., at least one transceiver), a storage medium 904, a user interface 906, a memory device 908, and a processing circuit 910 (e.g., at least one processor). These components can be coupled to and/or placed in electrical communication with one another via a signaling bus or other suitable component, represented generally by the connection lines in FIG. 9. The signaling bus may include any number of interconnecting buses and bridges depending on the specific application of the processing circuit 910 and the overall design constraints. The signaling bus links together various circuits such that each of the communication interface 902, the storage medium 904, the user interface 906, and the memory device 908 are coupled to and/or in electrical communication with the processing circuit 910. The signaling bus may also link various other circuits (not shown) such as timing sources, peripherals, voltage regulators, and power management circuits, which are well known in the art, and therefore, will not be described any further.

The communication interface 902 may be adapted to facilitate wireless communication of the apparatus 900. For example, the communication interface 902 may include circuitry and/or programming adapted to facilitate the communication of information bi-directionally with respect to one or more communication devices in a network. Thus, in some implementations, the communication interface 902 may be coupled to one or more antennas 912 for wireless communication within a wireless communication system. In some implementations, the communication interface 902 may be configured for wire-based communication. For example, the communication interface 902 could be a bus interface, a send/receive interface, or some other type of signal interface including drivers, buffers, or other circuitry for outputting and/or obtaining signals (e.g., outputting signal from and/or receiving signals into an integrated circuit). The communication interface 902 can be configured with one or more standalone receivers and/or transmitters, as well as one or more transceivers. In the illustrated example, the communication interface 902 includes a transmitter 914 and a receiver 916.

The memory device 908 may represent one or more memory devices. As indicated, the memory device 908 may maintain encoding-related information 918 along with other information used by the apparatus 900. In some implementations, the memory device 908 and the storage medium 904 are implemented as a common memory component. The memory device 908 may also be used for storing data that is manipulated by the processing circuit 910 or some other component of the apparatus 900.

The storage medium 904 may represent one or more computer-readable, machine-readable, and/or processor-readable devices for storing programming, such as processor executable code or instructions (e.g., software, firmware), electronic data, databases, or other digital information. The storage medium 904 may also be used for storing data that is manipulated by the processing circuit 910 when executing programming. The storage medium 904 may be any available media that can be accessed by a general purpose or special purpose processor, including portable or fixed storage devices, optical storage devices, and various other mediums capable of storing, containing or carrying programming.

By way of example and not limitation, the storage medium 904 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 904 may be embodied in an article of manufacture (e.g., a computer program product). By way of example, a computer program product may include a computer-readable medium in packaging materials. In view of the above, in some implementations, the storage medium 904 may be a non-transitory (e.g., tangible) storage medium.

The storage medium 904 may be coupled to the processing circuit 910 such that the processing circuit 910 can read information from, and write information to, the storage medium 904. That is, the storage medium 904 can be coupled to the processing circuit 910 so that the storage medium 904 is at least accessible by the processing circuit 910, including examples where at least one storage medium is integral to the processing circuit 910 and/or examples where at least one storage medium is separate from the processing circuit 910 (e.g., resident in the apparatus 900, external to the apparatus 900, distributed across multiple entities, etc.).

Programming stored by the storage medium 904, when executed by the processing circuit 910, causes the processing circuit 910 to perform one or more of the various functions and/or process operations described herein. For example, the storage medium 904 may include operations configured for regulating operations at one or more hardware blocks of the processing circuit 910, as well as to utilize the communication interface 902 for wireless communication utilizing their respective communication protocols.

The processing circuit 910 is generally adapted for processing, including the execution of such programming stored on the storage medium 904. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 910 is arranged to obtain, process and/or send data, control data access and storage, issue commands, and control other desired operations. The processing circuit 910 may include circuitry configured to implement desired programming provided by appropriate media in at least one example. For example, the processing circuit 910 may be implemented as one or more processors, one or more controllers, and/or other structure configured to execute executable programming Examples of the processing circuit 910 may include a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 910 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 910 are for illustration and other suitable configurations within the scope of the disclosure are also contemplated.

According to one or more aspects of the disclosure, the processing circuit 910 may be adapted to perform any or all of the features, processes, functions, operations and/or routines for any or all of the apparatuses described herein. For example, the processing circuit 910 may be configured to perform any of the steps, functions, and/or processes described with respect to FIGS. 1-5 and 10-12. As used herein, the term "adapted" in relation to the processing circuit 910 may refer to the processing circuit 910 being one or more of configured, used, implemented, and/or programmed to perform a particular process, function, operation and/or routine according to various features described herein.

The processing circuit 910 may be a specialized processor, such as an application specific integrated circuit (ASIC) that serves as a means for (e.g., structure for) carrying out any one of the operations described in conjunction with FIGS. 1-5 and 10-12. The processing circuit 910 may serve as one example of a means for transmitting and/or a means for receiving. In various implementations, the processing circuit 910 may provide and/or incorporate the functionality of the first wireless communication device 202 (e.g., the encoder 212) of FIG. 2 or the encoder 302 of FIG. 3.

According to at least one example of the apparatus 900, the processing circuit 910 may include one or more of a circuit/module for receiving 920, a circuit/module for determining a code block size 922, a circuit/module for selecting rate matching 924, a circuit/module for block encoding 926, a circuit/module for determining a power-of-two block size 928, a circuit/module for determining a difference 930, a circuit/module for calculating 932, or a circuit/module for comparing 934. In various implementations, the circuit/module for receiving 920, the circuit/module for determining a code block size 922, the circuit/module for selecting rate matching 924, the circuit/module for block encoding 926, the circuit/module for determining a power-of-two block size 928, the circuit/module for determining a difference 930, the circuit/module for calculating 932, or the circuit/module for comparing 934 may provide and/or incorporate, at least in part, the functionality described above for the first wireless communication device 202 (e.g., the encoder 212) of FIG. 2 or the encoder 302 of FIG. 3.

As mentioned above, programming stored by the storage medium 904, when executed by the processing circuit 910, causes the processing circuit 910 to perform one or more of the various functions and/or process operations described herein. For example, the programming may cause the processing circuit 910 to perform the various functions, steps, and/or processes described herein with respect to FIGS. 1-5 and 10-12 in various implementations. As shown in FIG. 9, the storage medium 904 may include one or more of code for receiving 936, code for determining a code block size 938, code for selecting rate matching 940, code for block encoding 942, code for determining a power-of-two block size 944, code for determining a difference 946, code for calculating 948, or code for comparing 950. In various implementations, the code for receiving 936, the code for determining a code block size 938, the code for selecting rate matching 940, the code for block encoding 942, the code for determining a power-of-two block size 944, the code for determining a difference 946, the code for calculating 948, or the code for comparing 950 may be executed or otherwise used to provide the functionality described herein for the circuit/module for receiving 920, the circuit/module for determining a code block size 922, the circuit/module for selecting rate matching 924, the circuit/module for block encoding 926, the circuit/module for determining a power-of-two block size 928, the circuit/module for determining a difference 930, the circuit/module for calculating 932, or the circuit/module for comparing 934.

The circuit/module for receiving 920 may include circuitry and/or programming (e.g., code for receiving 930 stored on the storage medium 904) adapted to perform several functions relating to, for example, receiving information. In some scenarios, the circuit/module for receiving 920 may obtain information (e.g., from the communication interface 902, the memory device, or some other component of the apparatus 900) and processes (e.g., decodes) the information. In some scenarios (e.g., if the circuit/module for receiving 920 is or includes an RF receiver), the circuit/module for receiving 920 may receive information directly from a device that transmitted the information. In either case, the circuit/module for receiving 920 may output the obtained information to another component of the apparatus 900 (e.g., the circuit/module for determining a code block size 922, the circuit/module for block encoding 926, the memory device 908, or some other component).

The circuit/module for receiving 920 (e.g., a means for receiving) may take various forms. In some aspects, the circuit/module for receiving 920 may correspond to, for example, an interface (e.g., a bus interface, a send/receive interface, or some other type of signal interface), a communication device, a transceiver, a receiver, or some other similar component as discussed herein. In some implementations, the communication interface 902 includes the circuit/module for receiving 920 and/or the code for receiving 930. In some implementations, the circuit/module for receiving 920 and/or the code for receiving 930 is configured to control the communication interface 902 (e.g., a transceiver or a receiver) to receive information.

The circuit/module for determining a code block size 922 may include circuitry and/or programming (e.g., code for determining a code block size 938 stored on the storage medium 904) adapted to perform several functions relating to, for example, determining a code block size for received information. In some aspects, the circuit/module for determining a code block size 922 (e.g., a means for determining a code block size) may correspond to, for example, a processing circuit.

In some scenarios, the circuit/module for determining a code block size 922 may obtain information (e.g., configuration information) that indicates the block sizes supported by an encoder (e.g.; an encoding algorithm). In some scenarios, the circuit/module for determining a code block size 922 may obtain information that indicates the resource size to be used to send the information (e.g., over a particular time-frequency resource). In some scenarios, the circuit/module for determining a code block size 922 may select the block size that best matches the resource size. The circuit/module for determining a code block size 922 may then output an indication of the code block size (e.g., to the circuit/module for selecting rate matching 924, the circuit/module for determining a power-of-two block size 928, the circuit/module for determining a difference 930, the memory device 908, or some other component).

The circuit/module for selecting rate matching 924 may include circuitry and/or programming (e.g., code for selecting rate matching 940 stored on the storage medium 904) adapted to perform several functions relating to, for example, selecting rate matching for encoding information. In some aspects, the circuit/module for selecting rate matching 924 (e.g., a means for selecting rate matching) may correspond to, for example, a processing circuit.

In some scenarios, the circuit/module for selecting rate matching 924 may select between repetition-based rate matching and puncture-based rate matching. In some scenarios, the selection is based on a code block size. In this case, the circuit/module for selecting rate matching 924 may obtain code block size information (e.g., from the circuit/module for determining a code block size 922, the memory device, or some other component of the apparatus 900). The circuit/module for selecting rate matching 924 decides which rate matching scheme to use based on, for example, the code block size (e.g., as discussed above in conjunction with FIGS. 2-4). The circuit/module for selecting rate matching 924 may then output an indication of the selection (e.g., to the circuit/module for block encoding 926, the memory device 908, an encoder, or some other component).

The circuit/module for block encoding 926 may include circuitry and/or programming (e.g., code for block encoding 942 stored on the storage medium 904) adapted to perform several functions relating to, for example, encoding information. In some aspects, the circuit/module for block encoding 926 (e.g., a means for block encoding) may correspond to, for example, a processing circuit.

In some aspects, the circuit/module for block encoding 926 may execute an encoding algorithm. For example, the circuit/module for block encoding 926 may perform a block coding algorithm or a Polar coding algorithm. The circuit/module for block encoding 926 may then output the resulting encoded information (e.g., to the communication interface 902, the memory device 908, or some other component).

The circuit/module for determining a power-of-two block size 928 may include circuitry and/or programming (e.g., code for determining a power-of-two block size 944 stored on the storage medium 904) adapted to perform several functions relating to, for example, determining a power-of-two block size that corresponds to a largest power-of-two integer that is less than the code block size. In some aspects, the circuit/module for determining a power-of-two block size 928 (e.g., a means for determining a power-of-two block size) may correspond to, for example, a processing circuit.

In some scenarios, the circuit/module for determining a power-of-two block size 928 may obtain code block size information (e.g., from the circuit/module for determining a code block size 922, the memory device, or some other component of the apparatus 900). The circuit/module for determining a power-of-two block size 928 identifies the particular power-of-two block size based on the code block size (e.g., as discussed above in conjunction with FIGS. 2-4). The circuit/module for determining a power-of-two block size 928 may then output an indication of the power-of-two block size (e.g., to the circuit/module for determining a difference 930, the memory device 908, or some other component).

The circuit/module for determining a difference 930 may include circuitry and/or programming (e.g., code for determining a difference 946 stored on the storage medium 904) adapted to perform several functions relating to, for example, determining a difference between the code block size and the power-of-two block size. In some aspects, the circuit/module for determining a difference 930 (e.g., a means for determining a difference) may correspond to, for example, a processing circuit.

The circuit/module for determining a difference 930 obtains code block size information (e.g., from the circuit/module for determining a code block size 922, the memory device, or some other component of the apparatus 900). The circuit/module for determining a difference 930 also obtains the power-of-two block size (e.g., from the circuit/module for determining the power-of-two block size 928, the memory device, or some other component of the apparatus 900). The circuit/module for determining a difference 930 subtracts one of these value from the other one of these values. The circuit/module for determining a difference 930 may then output the result of the subtraction (e.g., to the circuit/module for selecting rate matching 924, the circuit/module for comparing 934, the memory device 908, or some other component).

The circuit/module for calculating 932 may include circuitry and/or programming (e.g., code for calculating 948 stored on the storage medium 904) adapted to perform several functions relating to, for example, calculating a fraction. In some aspects, the circuit/module for calculating 932 (e.g., a means for calculating) may correspond to, for example, a processing circuit.

In some scenarios, the circuit/module for calculating 932 may obtain the power-of-two block size (e.g., from the circuit/module for determining the power-of-two block size 928, the memory device, or some other component of the apparatus 900). The circuit/module for calculating 932 may then perform an arithmetic operation on the power-of-two block size to determine a fraction of this value (e.g., as discussed above in conjunction with FIGS. 2-4). The circuit/module for calculating 932 may then output an indication of the calculation (e.g., to the circuit/module for comparing 934, the memory device 908, or some other component).

The circuit/module for comparing 934 may include circuitry and/or programming (e.g., code for comparing 950 stored on the storage medium 904) adapted to perform several functions relating to, for example, comparing two values. In some aspects, the circuit/module for comparing 934 (e.g., a means for comparing) may correspond to, for example, a processing circuit.

In one scenario, the circuit/module for comparing 934 obtains a difference value (e.g., from the circuit/module for determining a difference 930, the memory device, or some other component of the apparatus 900). In addition, the circuit/module for comparing 934 obtains a fraction value (e.g., from the circuit/module for calculating 932, the memory device, or some other component of the apparatus 900). The circuit/module for comparing 934 determines which one of these value is larger than the other one of these values (e.g., by performing a subtraction operation). The circuit/module for comparing 934 may then output the result of this determination (e.g., to the circuit/module for selecting rate matching 924, the memory device 908, or some other component).

First Example Process

Figure 10:
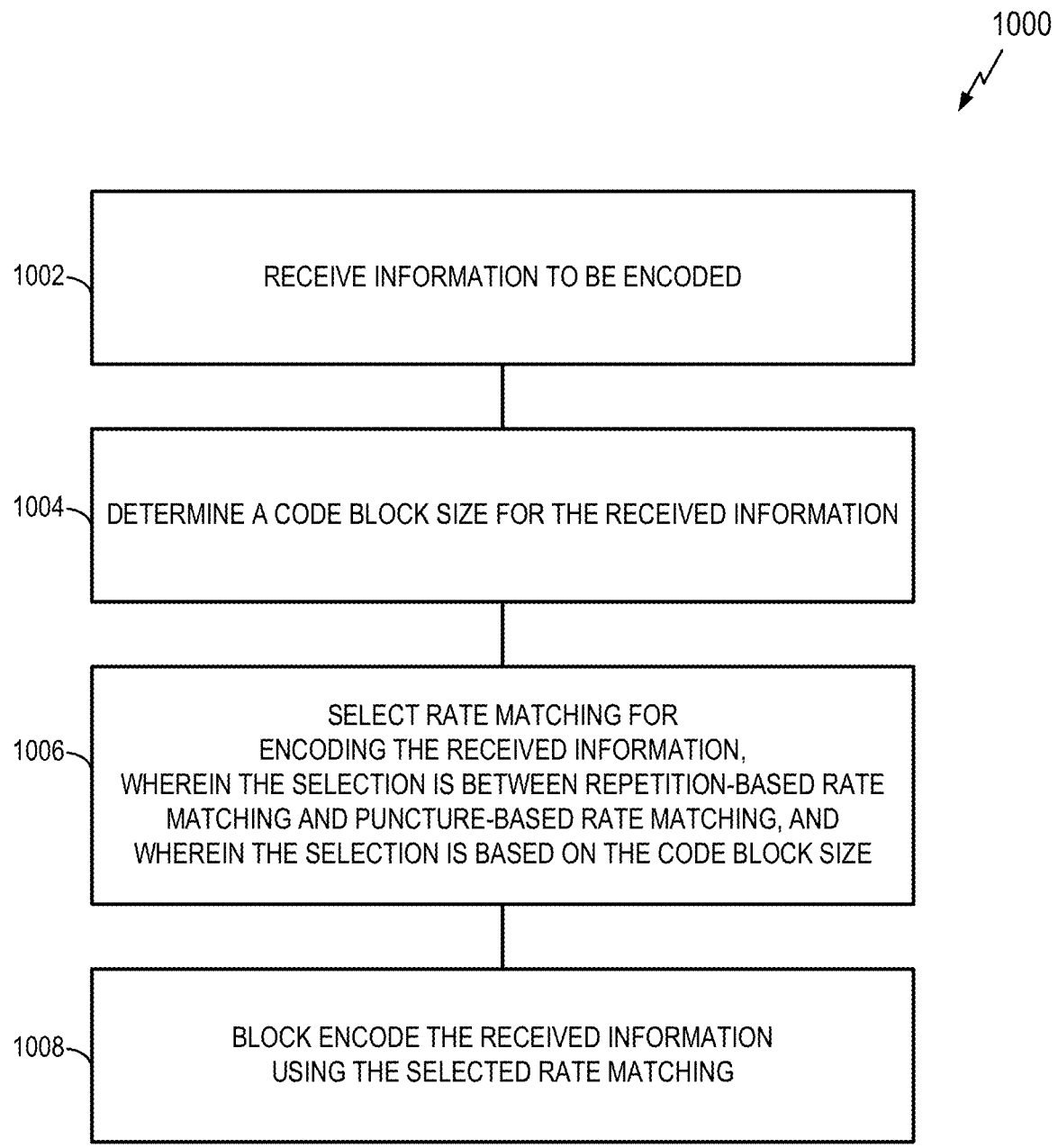
FIG. 10 is a flowchart illustrating an example of an encoding process with rate matching in accordance with some aspects of the disclosure.

FIG. 10 illustrates a process 1000 for communication in accordance with some aspects of the disclosure. One or more aspects of the process 1000 may be used in conjunction with (e.g., in addition to or as part of) the process 1000 of FIG. 10. Of course, in various aspects within the scope of the disclosure, the process 1000 may be implemented by any suitable apparatus capable of supporting signaling-related operations.

At block 1002, an apparatus (e.g., a device that include an encoder) receives information to be encoded.

In some implementations, the circuit/module for receiving 920 of FIG. 9 performs the operations of block 1002. In some implementations, the code for receiving 936 of FIG. 9 is executed to perform the operations of block 1002.

At block 1004, the apparatus determines a code block size for the received information.

In some implementations, the circuit/module for determining a code block size 922 of FIG. 9 performs the operations of block 1004. In some implementations, the code for determining a code block size 938 of FIG. 9 is executed to perform the operations of block 1004.

At block 1006, the apparatus selects rate matching for encoding the received information. In some aspects, the selection may be between repetition-based rate matching and puncture-based rate matching. In some aspects, the selection may be based on the code block size.

In some aspects, the selection of the rate matching may include selecting repetition-based rate matching or puncture-based rate matching. For example, the selection of the rate matching at block 1006 may involve selecting repetition-based rate matching if the comparison indicates that the difference is less than the fraction. Conversely, the selection of the rate matching at block 1006 may involve selecting puncture-based rate matching if the comparison indicates that the difference is greater than or equal to the fraction.

In some implementations, the circuit/module for selecting rate matching 924 of FIG. 9 performs the operations of block 1006. In some implementations, the code for selecting rate matching 940 of FIG. 9 is executed to perform the operations of block 1006.

At block 1008, the apparatus block encodes the received information using the selected rate matching. In some aspects, the block encoding may be Polar coding.

In cases where the block encoding uses the repetition-based rate matching (e.g., the rate matching selected at block 1006 is the repetition-based rate matching), the block encoding may include: generating block coded data based on the power-of-two block size; and adding repetition bits to the generated block coded data. In this case, the addition of repetition bits to the generated block coded data may involve adding a quantity of bits equal to the difference between the code block size and the power-of-two block size to the generated block coded data.

In cases where the block encoding uses the puncture-based rate matching (e.g., the rate matching selected at block 1006 is the puncture-based rate matching), the block encoding may include: generating block coded data based on double the power-of-two block size; and puncturing bits of the generated block coded data. In this case, the puncturing of bits of the generated block coded data may involve puncturing a quantity of bits equal to a difference between double the power-of-two block size and the code block size.

In some implementations, the circuit/module for block encoding 926 of FIG. 9 performs the operations of block 1008. In some implementations, the code for block encoding 942 of FIG. 9 is executed to perform the operations of block 1008.

In some aspects, the process 1000 may include any combination of two or more of the above features.

Second Example Process

Figure 11:
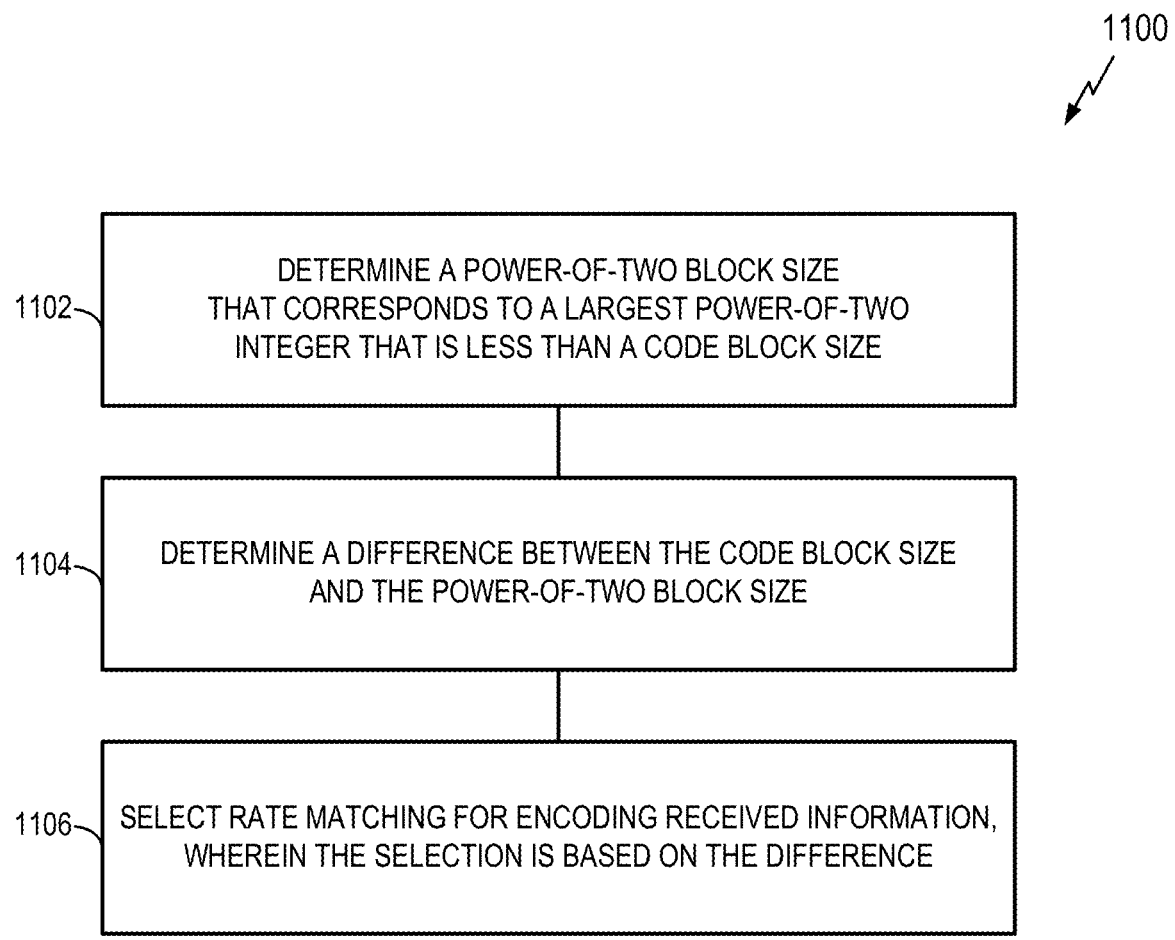
FIG. 11 is a flowchart illustrating an example of a rate matching process in accordance with some aspects of the disclosure.

FIG. 11 illustrates a process 1100 for communication in accordance with some aspects of the disclosure. One or more aspects of the process 1100 may be used in conjunction with (e.g., in addition to or as part of) the process 1000 of FIG. 10. The process 1100 may take place within a processing circuit (e.g., the processing circuit 910 of FIG. 9), which may be located in an access terminal, a base station, or some other suitable apparatus. Of course, in various aspects within the scope of the disclosure, the process 1100 may be implemented by any suitable apparatus capable of supporting signaling-related operations.

At block 1102, an apparatus (e.g., a device that include an encoder) determines a power-of-two block size that corresponds to a largest power-of-two integer that is less than a code block size (e.g., the code block size determined at block 1004 of FIG. 10).

In some implementations, the circuit/module for determining a power-of-two block size 928 of FIG. 9 performs the operations of block 1102. In some implementations, the code for determining a power-of-two block size 944 of FIG. 9 is executed to perform the operations of block 1102.

At block 1104, the apparatus determines a difference between the code block size and the power-of-two block size of block 1102.

In some implementations, the circuit/module for determining a difference 930 of FIG. 9 performs the operations of block 1104. In some implementations, the code for determining a difference 946 of FIG. 9 is executed to perform the operations of block 1104.

At block 1106, the apparatus selects rate matching for encoding received information (e.g., the information received at block 1002 of FIG. 10). In some aspects, this selection may be based on the difference determined at block 1104.

In some implementations, the circuit/module for selecting rate matching 924 of FIG. 9 performs the operations of block 1106. In some implementations, the code for selecting rate matching 940 of FIG. 9 is executed to perform the operations of block 1106.

In some aspects, the process 1100 may include any combination of two or more of the above features.

Third Example Process

Figure 12:
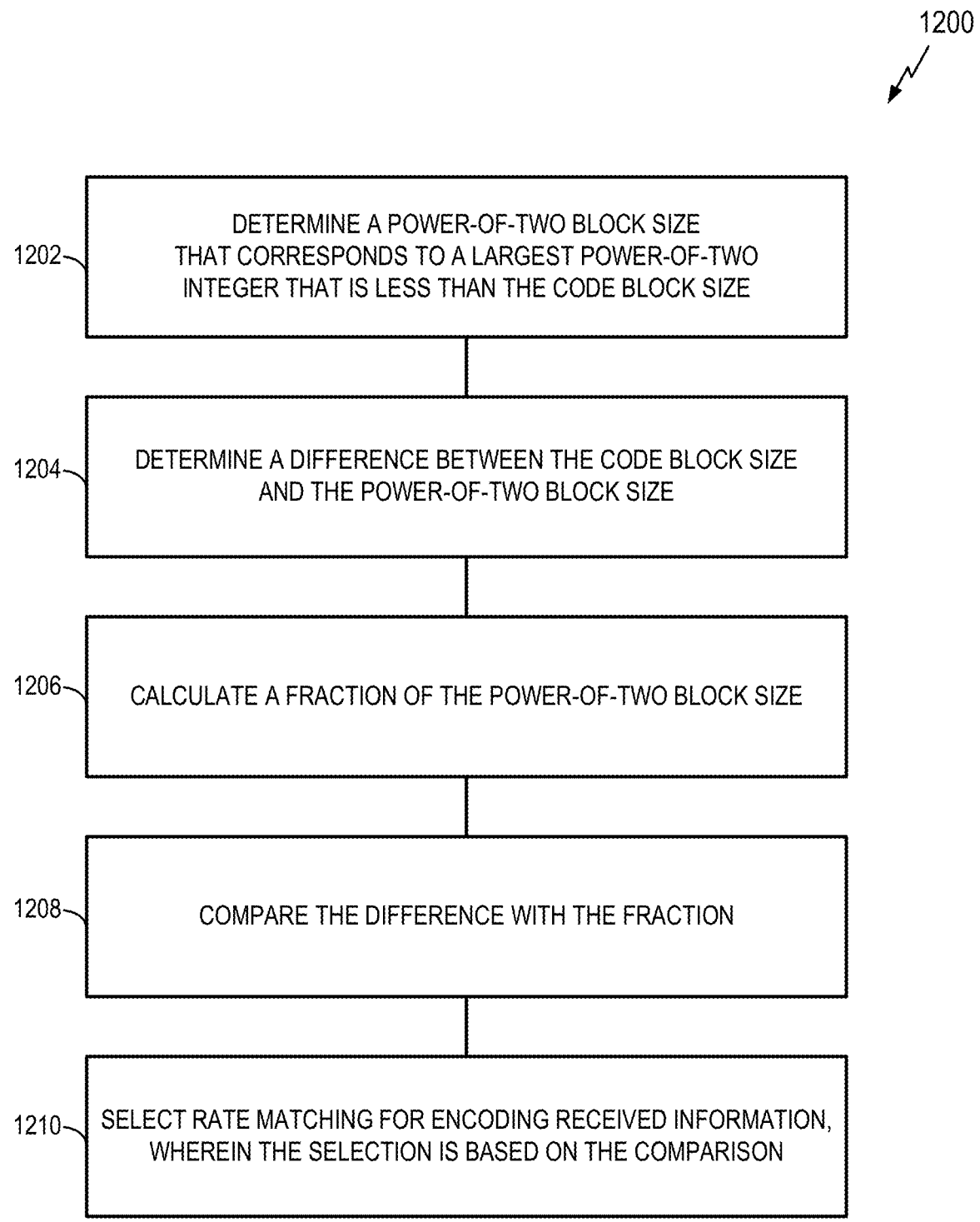
FIG. 12 is a flowchart illustrating an example of a rate matching process in accordance with some aspects of the disclosure.

FIG. 12 illustrates a process 1200 for communication in accordance with some aspects of the disclosure. One or more aspects of the process 1200 may be used in conjunction with (e.g., in addition to or as part of) the process 1000 of FIG. 10. The process 1200 may take place within a processing circuit (e.g., the processing circuit 910 of FIG. 9), which may be located in an access terminal, a base station, or some other suitable apparatus. Of course, in various aspects within the scope of the disclosure, the process 1200 may be implemented by any suitable apparatus capable of supporting signaling-related operations.

At block 1202, an apparatus (e.g., a device that include an encoder) determines a power-of-two block size that corresponds to a largest power-of-two integer that is less than a code block size (e.g., the code block size determined at block 1004 of FIG. 10).

In some implementations, the circuit/module for determining a power-of-two block size 928 of FIG. 9 performs the operations of block 1202. In some implementations, the code for determining a power-of-two block size 944 of FIG. 9 is executed to perform the operations of block 1202.

At block 1204, the apparatus determines a difference between the code block size and the power-of-two block size of block 1202.

In some implementations, the circuit/module for determining a difference 930 of FIG. 9 performs the operations of block 1204. In some implementations, the code for determining a difference 946 of FIG. 9 is executed to perform the operations of block 1204.

At block 1206, the apparatus calculates a fraction of the power-of-two block size determined at block 1202.

In some implementations, the circuit/module for calculating 932 of FIG. 9 performs the operations of block 1206. In some implementations, the code for calculating 948 of FIG. 9 is executed to perform the operations of block 1206.

At block 1208, the apparatus compares the difference determined at block 1204 with the fraction calculated at block 1206.

In some implementations, the circuit/module for comparing 934 of FIG. 9 performs the operations of block 1208. In some implementations, the code for comparing 948 of FIG. 9 is executed to perform the operations of block 1208.

At block 1210, the apparatus selects rate matching for encoding received information (e.g., the information received at block 1002 of FIG. 10). In some aspects, this selection may be based on the comparison of block 1208.

In some implementations, the circuit/module for selecting rate matching 924 of FIG. 9 performs the operations of block 1210. In some implementations, the code for selecting rate matching 940 of FIG. 9 is executed to perform the operations of block 1210.

In some aspects, the process 1200 may include any combination of two or more of the above features.

Second Example Apparatus

Figure 13:
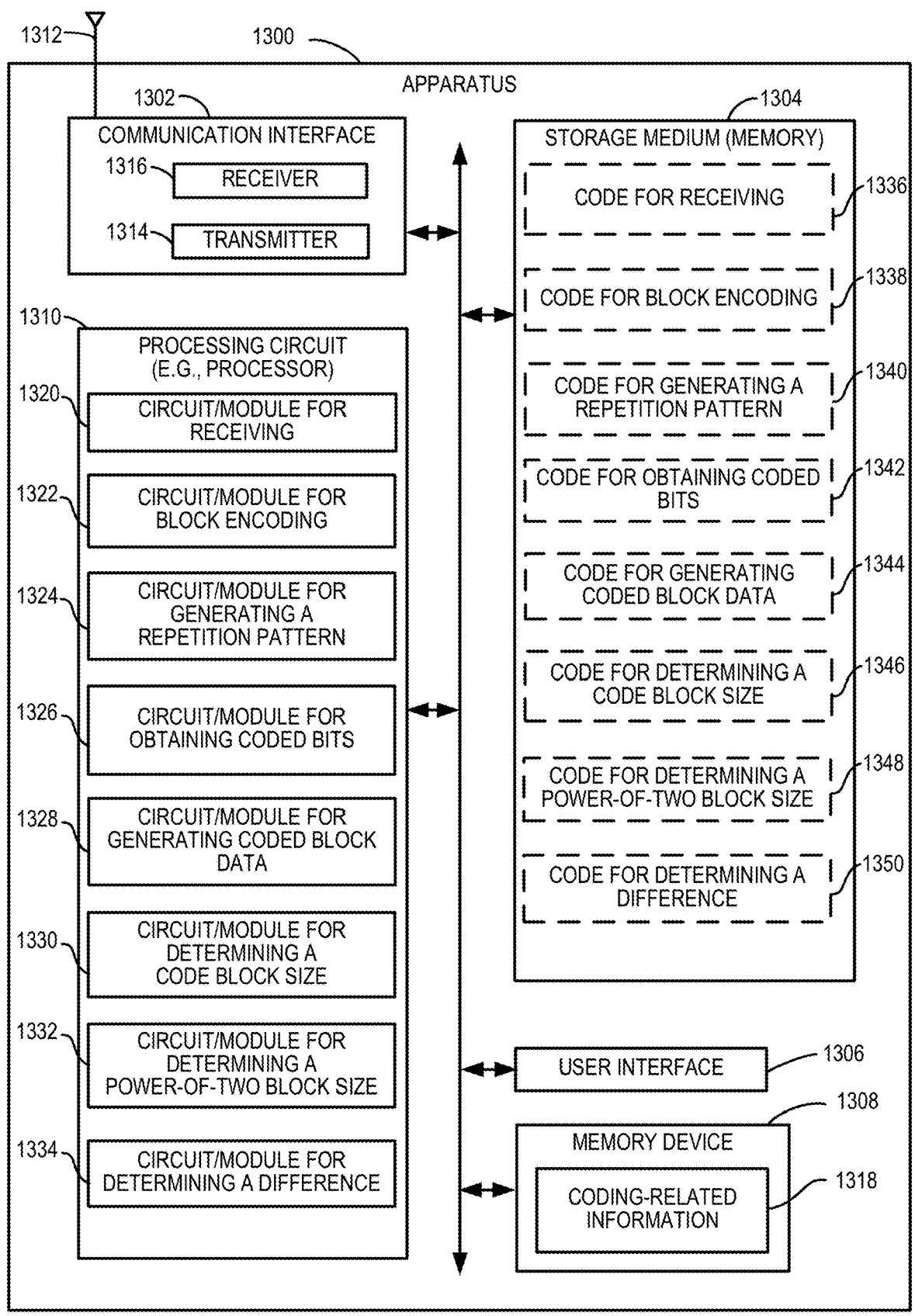
FIG. 13 is a block diagram illustrating an example hardware implementation for another apparatus (e.g., an electronic device) that can support encoding in accordance with some aspects of the disclosure.

FIG. 13 illustrates a block diagram of an example hardware implementation of an apparatus 1300 configured to use encoding according to one or more aspects of the disclosure. The apparatus 1300 could embody or be implemented within a UE, a transmit receive point (TRP), a base station, or some other type of device that supports encoding as taught herein. In various implementations, the apparatus 1300 could embody or be implemented within an access terminal, an access point, or some other type of device. In various implementations, the apparatus 1300 could embody or be implemented within a mobile phone, a smart phone, a tablet, a portable computer, a server, a network entity, a personal computer, a sensor, an alarm, a vehicle, a machine, an entertainment device, a medical device, or any other electronic device having circuitry.

The apparatus 1300 includes a communication interface 1302 (e.g., at least one transceiver), a storage medium 1304, a user interface 1306, a memory device 1308 (e.g., storing token-related information 1318), and a processing circuit 1310 (e.g., at least one processor). In various implementations, the user interface 1306 may include one or more of: a keypad, a display, a speaker, a microphone, a touchscreen display, of some other circuitry for receiving an input from or sending an output to a user. The communication interface 1302 may be coupled to one or more antennas 1312, and may include a transmitter 1314 and a receiver 1316. In general, the components of FIG. 13 may be similar to corresponding components of the apparatus 900 of FIG. 9.

According to one or more aspects of the disclosure, the processing circuit 1310 may be adapted to perform any or all of the features, processes, functions, operations and/or routines for any or all of the apparatuses described herein. For example, the processing circuit 1310 may be configured to perform any of the steps, functions, and/or processes described with respect to FIGS. 1-5 and 14-16. As used herein, the term "adapted" in relation to the processing circuit 1310 may refer to the processing circuit 1310 being one or more of configured, used, implemented, and/or programmed to perform a particular process, function, operation and/or routine according to various features described herein.

The processing circuit 1310 may be a specialized processor, such as an application specific integrated circuit (ASIC) that serves as a means for (e.g., structure for) carrying out any one of the operations described in conjunction with FIGS. 1-5 and 14-16. The processing circuit 1310 may serve as one example of a means for transmitting and/or a means for receiving. In various implementations, the processing circuit 1310 may provide and/or incorporate the functionality of the first wireless communication device 202 (e.g., the encoder 212) of FIG. 2 or the encoder 302 of FIG. 3.

According to at least one example of the apparatus 1300, the processing circuit 1310 may include one or more of a circuit/module for receiving 1320, a circuit/module for block encoding 1322, a circuit/module for generating a repetition pattern 1324, a circuit/module for obtaining coded bits 1326, a circuit/module for generating coded block data 1328, a circuit/module for determining a code block size 1330, a circuit/module for determining a power-of-two block size 1332, or a circuit/module for determining a difference 1334.

As mentioned above, programming stored by the storage medium 1304, when executed by the processing circuit 1310, causes the processing circuit 1310 to perform one or more of the various functions and/or process operations described herein in conjunction with FIGS. 1-5 and 14-16. For example, the storage medium 1304 may include one or more of code for receiving 1336, code for block encoding 1338, code for generating a repetition pattern 1340, code for obtaining coded bits 1342, code for generating coded block data 1344, code for determining a code block size 1346, code for determining a power-of-two block size 1348, or code for determining a difference 1350. In various implementations, the code for receiving 1336, the code for block encoding 1338, the code for generating a repetition pattern 1340, the code for obtaining coded bits 1342, the code for generating coded block data 1344, the code for determining a code block size 1346, the code for determining a power-of-two block size 1348, or the code for determining a difference 1350 may be executed or otherwise used to provide the functionality described herein for the circuit/module for receiving 1320, the circuit/module for block encoding 1322, the circuit/module for generating a repetition pattern 1324, the circuit/module for obtaining coded bits 1326, the circuit/module for generating coded block data 1328, the circuit/module for determining a code block size 1330, the circuit/module for determining a power-of-two block size 1332, or the circuit/module for determining a difference 1334.

The circuit/module for receiving 1320 may include circuitry and/or programming (e.g., code for receiving 1336 stored on the storage medium 1304) adapted to perform several functions relating to, for example, receiving information. In some scenarios, the circuit/module for receiving 1320 may obtain information (e.g., from the communication interface 1302, the memory device, or some other component of the apparatus 1300) and processes (e.g., decodes) the information. In some scenarios (e.g., if the circuit/module for receiving 1320 is or includes an RF receiver), the circuit/module for receiving 1320 may receive information directly from a device that transmitted the information. In either case, the circuit/module for receiving 1320 may output the obtained information to another component of the apparatus 1300 (e.g., the circuit/module for block encoding 1322, the circuit/module for determining a code block size 1330, the memory device 1308, or some other component).

The circuit/module for receiving 1320 (e.g., a means for receiving) may take various forms. In some aspects, the circuit/module for receiving 1320 may correspond to, for example, an interface (e.g., a bus interface, a send/receive interface, or some other type of signal interface), a communication device, a transceiver, a receiver, or some other similar component as discussed herein. In some implementations, the communication interface 1302 includes the circuit/module for receiving 1320 and/or the code for receiving 1336. In some implementations, the circuit/module for receiving 1320 and/or the code for receiving 1336 is configured to control the communication interface 1302 (e.g., a transceiver or a receiver) to receive information.

The circuit/module for block encoding 1322 may include circuitry and/or programming (e.g., code for block encoding 1338 stored on the storage medium 1304) adapted to perform several functions relating to, for example, encoding information. In some aspects, the circuit/module for block encoding 1322 (e.g., a means for block encoding) may correspond to, for example, a processing circuit.

In some aspects, the circuit/module for block encoding 1322 may execute an encoding algorithm. For example, the circuit/module for block encoding 1322 may perform a block coding algorithm or a Polar coding algorithm. The circuit/module for determining a block encoding 1322 may then output the resulting encoded information (e.g., to communication interface 1302, the memory device 1308, or some other component).

The circuit/module for generating a repetition pattern 1324 may include circuitry and/or programming (e.g., code for generating a repetition pattern 1340 stored on the storage medium 1304) adapted to perform several functions relating to, for example, generating a repetition pattern for encoded information. In some aspects, the circuit/module for generating a repetition pattern 1324 (e.g., a means for generating a repetition pattern) may correspond to, for example, a processing circuit.

In some aspects, the circuit/module for generating a repetition pattern 1324 may generate a repetition pattern as described above, for example, in conjunction with FIGS. 2 and 5. The circuit/module for generating a repetition pattern 1324 may then output the resulting repetition pattern (e.g., to the circuit/module for obtaining coded bits 1326, the memory device 1308, or some other component).

The circuit/module for obtaining coded bits 1326 may include circuitry and/or programming (e.g., code for obtaining coded bits 1342 stored on the storage medium 1304) adapted to perform several functions relating to, for example, obtaining coded bits to be added to coded data. In some aspects, the circuit/module for obtaining coded bits 1326 (e.g., a means for obtaining coded bits) may correspond to, for example, a processing circuit.

In some scenarios, the circuit/module for obtaining coded bits 1326 may obtain a repetition pattern (e.g., from the circuit/module for generating a repetition pattern 1324, the memory device, or some other component of the apparatus 1300). The circuit/module for obtaining coded bits 1326 may then extract bits from the repetition pattern (e.g., as discussed above in conjunction with FIG. 5). In some aspects, the number of coded bit to be obtained may be based on the difference between the code block size and the power-of-two block size. The circuit/module for obtaining coded bits 1326 then outputs the coded bits (e.g., to the circuit/module for generating coded block data 1328, the memory device 1308, or some other component).

The circuit/module for generating coded block data 1328 may include circuitry and/or programming (e.g., code for generating coded block data 1344 stored on the storage medium 1304) adapted to perform several functions relating to, for example, generating coded information. In some aspects, the circuit/module for generating coded block data 1328 (e.g., a means for generating coded block data) may correspond to, for example, a processing circuit.

In some aspects, the circuit/module for generating coded block data 1328 may add coded bits to block coded data. To this end, the circuit/module for generating coded block data 1328 may obtain coded bits (e.g., from the circuit/module for obtaining coded bits 1326, the memory device, or some other component of the apparatus 1300). In addition, the circuit/module for generating coded block data 1328 may obtain block coded data (e.g., from the circuit/module for block encoding 1322, the memory device, or some other component of the apparatus 1300). The circuit/module for generating coded block data 1328 then combines the coded bits and the block coded data (e.g., as discussed above in conjunction with FIG. 5). The circuit/module for generating coded block data 1328 may then output the resulting block coded data (e.g., to communication interface 1302, the memory device 1308, or some other component).

The circuit/module for determining a code block size 1330 may include circuitry and/or programming (e.g., code for determining a code block size 1346 stored on the storage medium 1304) adapted to perform several functions relating to, for example, determining a code block size for received information. In some aspects, the circuit/module for determining a code block size 1330 (e.g., a means for determining a code block size) may correspond to, for example, a processing circuit.

In some scenarios, the circuit/module for determining a code block size 1330 may obtain information (e.g., configuration information) that indicates the block sizes supported by an encoder (e.g.; an encoding algorithm). In some scenarios, the circuit/module for determining a code block size 1330 may obtain information that indicates the resource size to be used to send the information (e.g., over a particular time-frequency resource). In some scenarios, the circuit/module for determining a code block size 1330 may select the block size that best matches the resource size. The circuit/module for determining a code block size 1330 may then output an indication of the code block size (e.g., to the circuit/module for determining a power-of-two block size 1332, the circuit/module for determining a difference 1334, the memory device 1308, or some other component).

The circuit/module for determining a power-of-two block size 1332 may include circuitry and/or programming (e.g., code for determining a power-of-two block size 1348 stored on the storage medium 1304) adapted to perform several functions relating to, for example, determining a power-of-two block size that corresponds to a largest power-of-two integer that is less than the code block size. In some aspects, the circuit/module for determining a power-of-two block size 1332 (e.g., a means for determining a power-of-two block size) may correspond to, for example, a processing circuit.

In some scenarios, the circuit/module for determining a power-of-two block size 1332 may obtain code block size information (e.g., from the circuit/module for determining a code block size 1330, the memory device, or some other component of the apparatus 1300). The circuit/module for determining a power-of-two block size 1332 identifies the particular power-of-two block size based on the code block size (e.g., as discussed above in conjunction with FIGS. 2-4). The circuit/module for determining a power-of-two block size 1332 may then output an indication of the power-of-two block size (e.g., to the circuit/module for determining a difference 1334, the memory device 1308, or some other component).

The circuit/module for determining a difference 1334 may include circuitry and/or programming (e.g., code for determining a difference 1350 stored on the storage medium 1304) adapted to perform several functions relating to, for example, determining a difference between the code block size and the power-of-two block size. In some aspects, the circuit/module for determining a difference 1334 (e.g., a means for determining a difference) may correspond to, for example, a processing circuit.

The circuit/module for determining a difference 1334 obtains code block size information (e.g., from the circuit/module for determining a code block size 1330, the memory device, or some other component of the apparatus 1300). The circuit/module for determining a difference 1334 also obtains the power-of-two block size (e.g., from the circuit/module for determining the power-of-two block size 1332, the memory device, or some other component of the apparatus 1300). The circuit/module for determining a difference 1334 subtracts one of these value from the other one of these values. The circuit/module for determining a difference 1334 may then output the result of the subtraction (e.g., to the circuit/module for generating a repetition pattern 1324, the memory device 1308, or some other component).

Fourth Example Process

Figure 14:
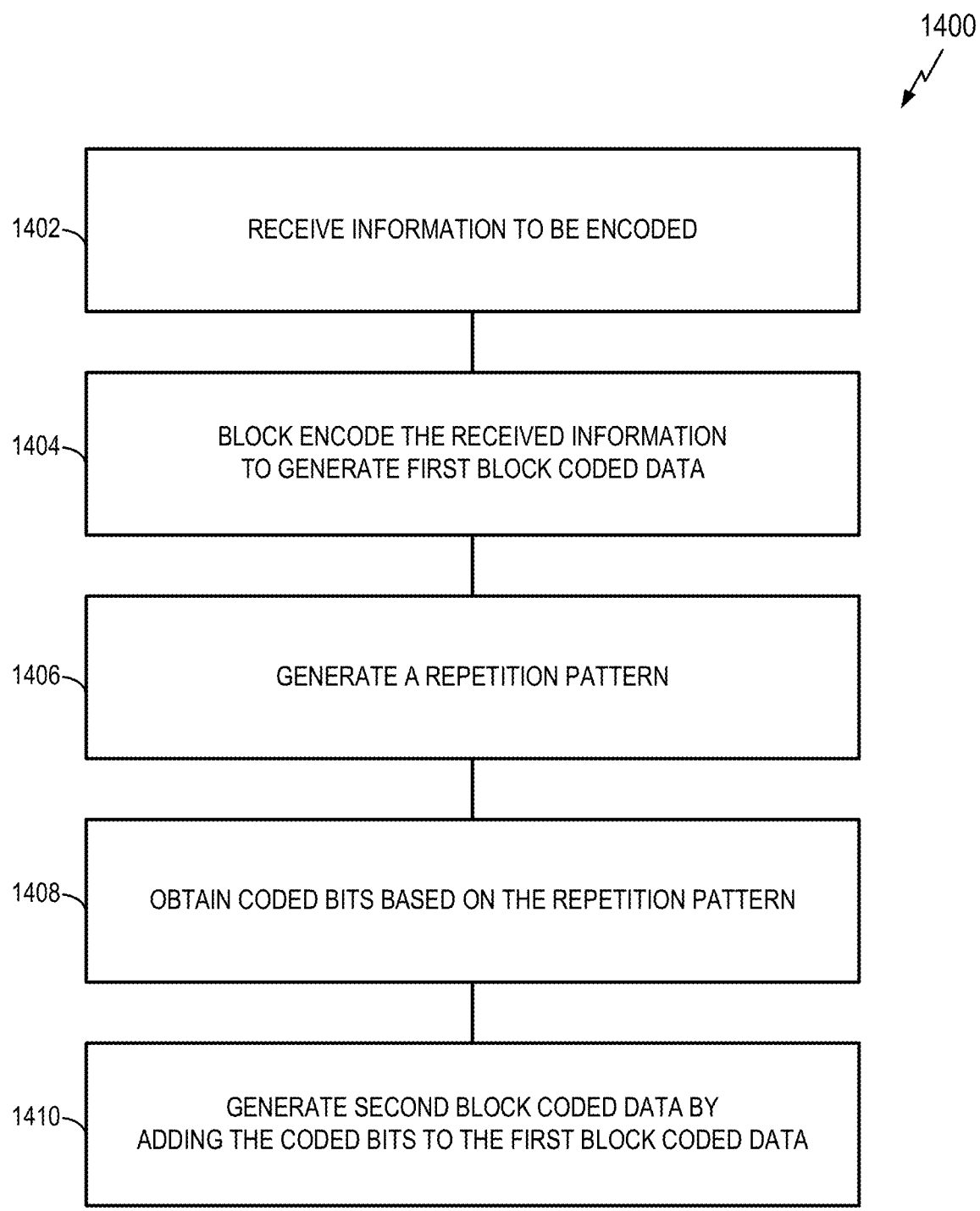
FIG. 14 is a flow diagram illustrating an example of a repetition-based encoding process in accordance with some aspects of the disclosure.

FIG. 14 illustrates a process 1400 for communication in accordance with some aspects of the disclosure. The process 1400 may take place within a processing circuit (e.g., the processing circuit 1310 of FIG. 13), which may be located in an access terminal, a base station, or some other suitable apparatus. Of course, in various aspects within the scope of the disclosure, the process 1400 may be implemented by any suitable apparatus capable of supporting signaling-related operations.

At block 1402, an apparatus (e.g., a device that include an encoder) receives information to be encoded.

In some implementations, the circuit/module for receiving 1320 of FIG. 13 performs the operations of block 1402. In some implementations, the code for receiving 1336 of FIG. 13 is executed to perform the operations of block 1402.

At block 1404, the apparatus block encodes the received information to generate first block coded data. In some aspects, the block encoding may include Polar coding.

In some implementations, the circuit/module for block encoding 1322 of FIG. 13 performs the operations of block 1404. In some implementations, the code for block encoding 1338 of FIG. 13 is executed to perform the operations of block 1404.

At block 1406, the apparatus generates a repetition pattern. In some aspects, the repetition pattern may consist of a quantity of bits corresponding to a code block size for the received information.

In some aspects, the generation of the repetition pattern may include: generating a first repetition pattern; and generating a second repetition pattern based on a bit-reversal permutation of the first repetition pattern. In this case, the coded bits may be obtained from locations indicated by the second repetition pattern.

In some aspects, the block encoding may generate the first block coded data with the power-of-two block size. Accordingly, the process 1400 may include determining a code block size for the received information; and determining a power-of-two block size by identifying a largest power-of-two integer that is less than the code block size. In addition, the repetition pattern may consist of a quantity of bits corresponding to the code block size.

In some aspects, the process 1400 may include determining a difference between the code block size and the power-of-two block size. In this case, the generation of the repetition pattern may involve including, in the repetition pattern, a quantity of ones equal to the difference between the code block size and the power-of-two block size. In some aspects, the generation of the repetition pattern may involve including a quantity of ones equal to the difference to the end of the repetition pattern.

In some aspects, the first block coded data may have a power-of-two block size. In some aspects, the process 1400 may include determining a difference between the code block size and the power-of-two block size. Here, the generation of the first repetition pattern may involve including, in the repetition pattern, a quantity of ones equal to the difference between the code block size and the power-of-two block size.

In some implementations, the circuit/module for generating a repetition pattern 1324 of FIG. 13 performs the operations of block 1406. In some implementations, the code for generating a repetition pattern 1340 of FIG. 13 is executed to perform the operations of block 1406.

At block 1408, the apparatus obtains coded bits based on the repetition pattern. In some aspects, the obtaining of the coded bits based on the repetition pattern may include obtaining a quantity of coded bits based on the difference between the code block size and the power-of-two block size. In some aspects, the obtaining of the coded bits based on the repetition pattern may include: obtaining a quantity of coded bits equal to the difference between the code block size and the power-of-two block size, where the coded bits are obtained from locations indicated by the repetition pattern.

In some implementations, the circuit/module for obtaining coded bits 1326 of FIG. 13 performs the operations of block 1408. In some implementations, the code for obtaining coded bits 1342 of FIG. 13 is executed to perform the operations of block 1408.

At block 1410, the apparatus generates second block coded data by adding the coded bits to the first block coded data. In some aspects, the addition of the coded bits to the first block coded data may include appending the coded bits to the end of the first block coded data.

I In some implementations, the circuit/module for generating coded block data 1328 of FIG. 13 performs the operations of block 1410. In some implementations, the code for generating coded block data 1344 of FIG. 13 is executed to perform the operations of block 1410.

In some aspects, the process 1400 may include any combination of two or more of the above features.

Fifth Example Process

Figure 15:
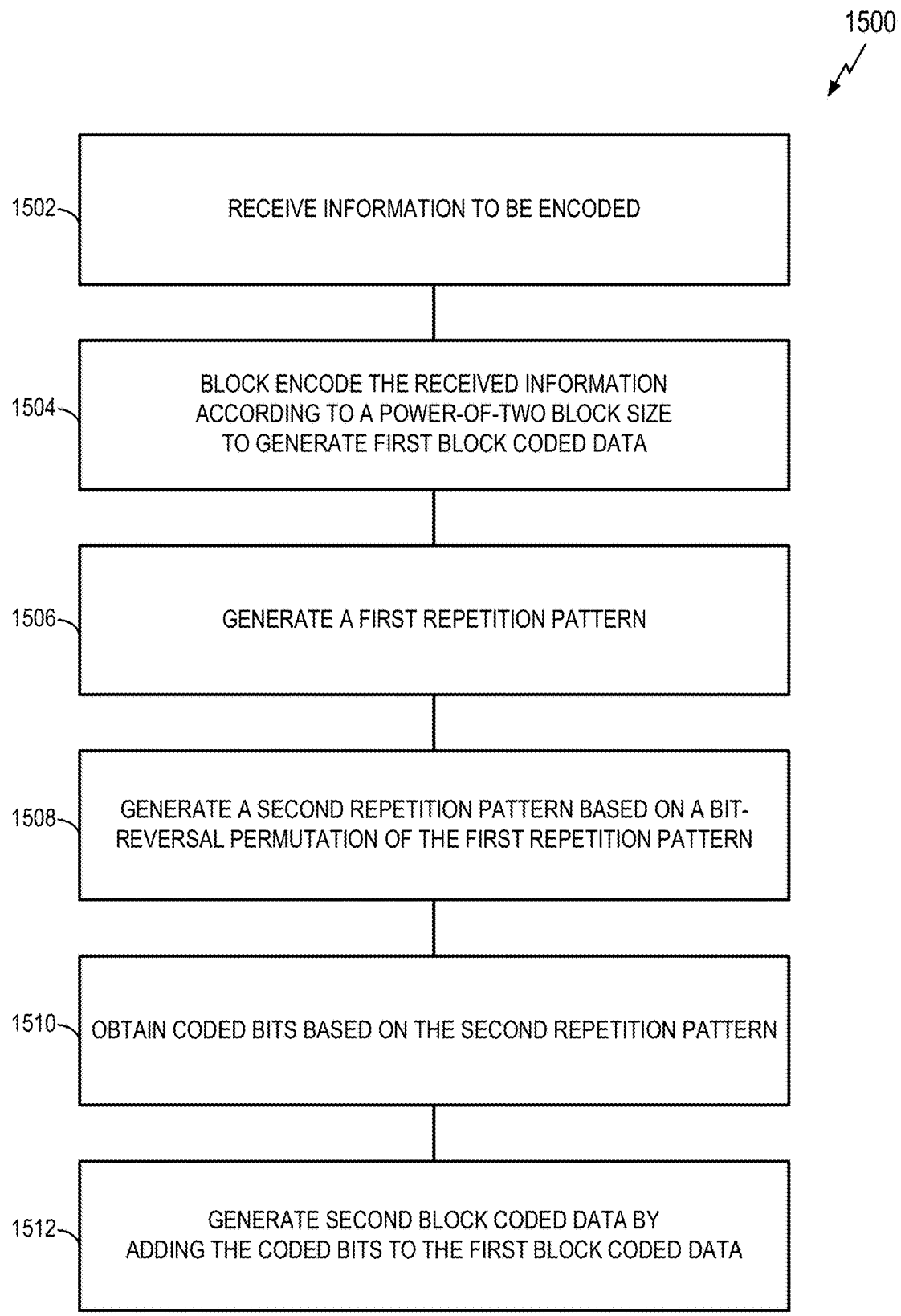
FIG. 15 is a flow diagram illustrating an example of another repetition-based encoding process in accordance with some aspects of the disclosure.

FIG. 15 illustrates a process 1500 for communication in accordance with some aspects of the disclosure. The process 1500 may take place within a processing circuit (e.g., the processing circuit 1310 of FIG. 13), which may be located in an access terminal, a base station, or some other suitable apparatus. Of course, in various aspects within the scope of the disclosure, the process 1500 may be implemented by any suitable apparatus capable of supporting signaling-related operations.

At block 1502, an apparatus (e.g., a device that include an encoder) receives information to be encoded.

In some implementations, the circuit/module for receiving 1320 of FIG. 13 performs the operations of block 1502. In some implementations, the code for receiving 1336 of FIG. 13 is executed to perform the operations of block 1502.

At block 1504, the apparatus block encodes the received information according to a power-of-two block size to generate first block coded data. In some aspects, the block encoding may include Polar coding.

In some implementations, the circuit/module for block encoding 1322 of FIG. 13 performs the operations of block

1504. In some implementations, the code for block encoding 1338 of FIG. 13 is executed to perform the operations of block 1504.

At block 1506, the apparatus generates a first repetition pattern. In some aspects, the process 1500 may include determining a code block size for the received information; determining the power-of-two block size by identifying a largest power-of-two integer that is less than the code block size; and determining a difference between the code block size and the power-of-two block size. Here, the generation of the first repetition pattern may involve including a quantity of ones equal to the difference to the end of the first repetition pattern.

In some implementations, the circuit/module for generating a repetition pattern 1324 of FIG. 13 performs the operations of block 1506. In some implementations, the code for generating a repetition pattern 1340 of FIG. 13 is executed to perform the operations of block 1506.

At block 1508, the apparatus generates a second repetition pattern based on a bit-reversal permutation of the first repetition pattern.

In some implementations, the circuit/module for generating a repetition pattern 1324 of FIG. 13 performs the operations of block 1508. In some implementations, the code for generating a repetition pattern 1340 of FIG. 13 is executed to perform the operations of block 1508.

At block 1510, the apparatus obtains coded bits based on the second repetition pattern. In some aspects, the obtaining of the coded bits based on the second repetition pattern may include: obtaining a quantity of coded bits equal to the difference between the code block size and the power-of-two block size, where the coded bits are obtained from locations indicated by the second repetition pattern.

In some implementations, the circuit/module for obtaining coded bits 1326 of FIG. 13 performs the operations of block 1510. In some implementations, the code for obtaining coded bits 1342 of FIG. 13 is executed to perform the operations of block 1510.

At block 1512, the apparatus generates second block coded data by adding the coded bits to the first block coded data. In some aspects, the addition of the coded bits to the first block coded data may include appending the coded bits to the end of the first block coded data.

I In some implementations, the circuit/module for generating coded block data 1328 of FIG. 13 performs the operations of block 1512. In some implementations, the code for generating coded block data 1344 of FIG. 13 is executed to perform the operations of block 1512.

In some aspects, the process 1500 may include any combination of two or more of the above features.

Sixth Example Process

Figure 16:
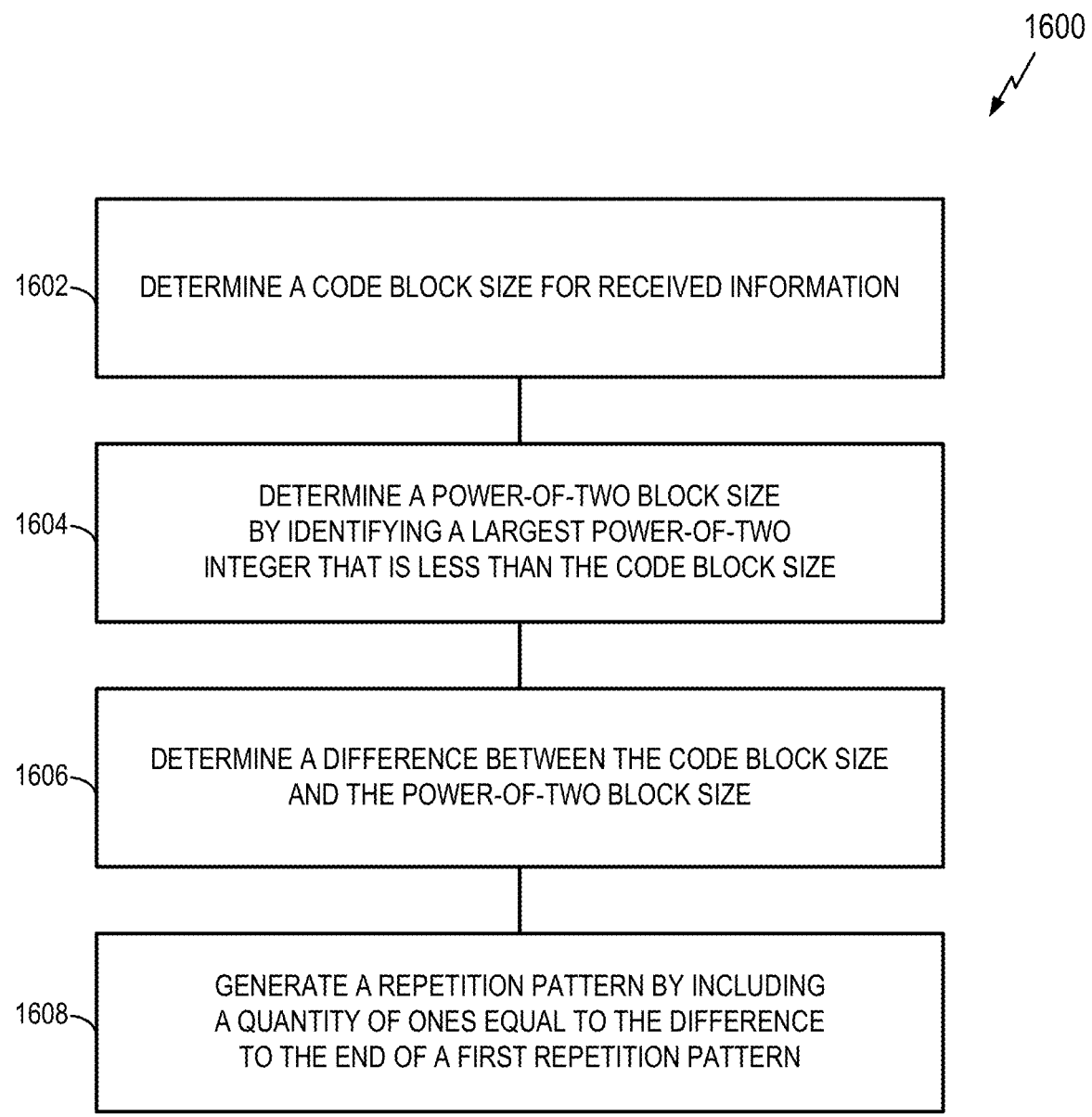
FIG. 16 is a flow diagram illustrating an example of a process for generating a repetition pattern in accordance with some aspects of the disclosure.

FIG. 16 illustrates a process 1600 for communication in accordance with some aspects of the disclosure. One or more aspects of the process 1600 may be used in conjunction with (e.g., in addition to or as part of) the process 1400 of FIG. 14 or the process 1500 of FIG. 15. The process 1600 may take place within a processing circuit (e.g., the processing circuit 1310 of FIG. 13), which may be located in an access terminal, a base station, or some other suitable apparatus. Of course, in various aspects within the scope of the disclosure, the process 1600 may be implemented by any suitable apparatus capable of supporting signaling-related operations.

At block 1602, an apparatus (e.g., a device that include an encoder) determines a code block size for received information (e.g., the information received at block 1402 of FIG. 14 or block 1502 of FIG. 15).

In some implementations, the circuit/module for determining a code block size 1330 of FIG. 13 performs the operations of block 1602. In some implementations, the code for determining a code block size 1346 of FIG. 13 is executed to perform the operations of block 1602.

At block 1604, the apparatus determines a power-of-two block size by identifying a largest power-of-two integer that is less than the code block size determined at block 1602.

In some implementations, the circuit/module for determining a power-of-two block size 1332 of FIG. 13 performs the operations of block 1604. In some implementations, the code for determining a power-of-two block size 1348 of FIG. 13 is executed to perform the operations of block 1604.

At block 1606, the apparatus determines a difference between the code block size determined at block 1602 and the power-of-two block size determined at block 1604.

In some implementations, the circuit/module for determining a difference 1334 of FIG. 13 performs the operations of block 1606. In some implementations, the code for determining a difference 1350 of FIG. 13 is executed to perform the operations of block 1606.

At block 1608, the apparatus generates a repetition pattern by including a quantity of ones equal to the difference of block 1606 to the end of a first repetition pattern (e.g., the first repetition pattern of block 1506 of FIG. 15).

In some implementations, the circuit/module for generating a repetition pattern 1324 of FIG. 13 performs the operations of block 1608. In some implementations, the code for generating a repetition pattern 1340 of FIG. 13 is executed to perform the operations of block 1608.

In some aspects, the process 1600 may include any combination of two or more of the above features.

Other Aspects

In one aspect, the disclosure provides an apparatus configured for communication that includes a memory and a processor coupled to the memory. The processor and the memory are configured to: receive information to be encoded; block encode the received information according to a power-of-two block size to generate first block coded data; generate a first repetition pattern; generate a second repetition pattern based on a bit-reversal permutation of the first repetition pattern; obtain coded bits based on the second repetition pattern; and generate second block coded data by adding the coded bits to the first block coded data.

Another aspect of the disclosure provides a method for communication including: receiving information to be encoded; block encoding the received information according to a power-of-two block size to generate first block coded data; generating a first repetition pattern; generating a second repetition pattern based on a bit-reversal permutation of the first repetition pattern; obtaining coded bits based on the second repetition pattern; and generating second block coded data by adding the coded bits to the first block coded data.

Another aspect of the disclosure provides an apparatus configured for communication. The apparatus including: means for receiving information to be encoded; means for block encoding the received information according to a power-of-two block size to generate first block coded data; means for generating a first repetition pattern; means for generating a second repetition pattern based on a bit-reversal permutation of the first repetition pattern; means for obtaining coded bits based on the second repetition pattern; and means for generating second block coded data by adding the coded bits to the first block coded data.

Another aspect of the disclosure provides a non-transitory computer-readable medium storing computer-executable code, including code to: receive information to be encoded; block encode the received information according to a power-of-two block size to generate first block coded data; generate a first repetition pattern; generate a second repetition pattern based on a bit-reversal permutation of the first repetition pattern; obtain coded bits based on the second repetition pattern; and generate second block coded data by adding the coded bits to the first block coded data.

Additional Aspects

The examples set forth herein are provided to illustrate certain concepts of the disclosure. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

As those skilled in the art will readily appreciate, various aspects described throughout this disclosure may be extended to any suitable telecommunication system, network architecture, and communication standard. By way of example, various aspects may be applied to wide area networks, peer-to-peer network, local area network, other suitable systems, or any combination thereof, including those described by yet-to-be defined standards. Various aspects may be applied to 3GPP 5G systems and/or other suitable systems, including those described by yet-to-be defined wide area network standards. Various aspects may also be applied to systems using LTE (in FDD, TDD, or both modes), LTE-Advanced (LTE-A) (in FDD, TDD, or both modes), Universal Mobile Telecommunications System (UMTS), Global System for Mobile Communications (GSM), Code Division Multiple Access (CDMA), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. Various aspects may also be applied to UMTS systems such as W-CDMA, TD-SCDMA, and TD-CDMA. The actual telecommunication standard, network architecture, and/or communication standard used will depend on the specific application and the overall design constraints imposed on the system.

Many aspects are described in terms of sequences of actions to be performed by, for example, elements of a computing device. It will be recognized that various actions described herein can be performed by specific circuits, for example, central processing units (CPUs), graphic processing units (GPUs), digital signal processors (DSPs), application specific integrated circuits (ASICs), field programmable gate arrays (FPGAs), or various other types of general purpose or special purpose processors or circuits, by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

One or more of the components, steps, features and/or functions illustrated in above may be rearranged and/or combined into a single component, step, feature or function or embodied in several components, steps, or functions. Additional elements, components, steps, and/or functions may also be added without departing from novel features disclosed herein. The apparatus, devices, and/or components illustrated above may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of example processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An example of a storage medium is coupled to the processor such that the processor can read information from, and write information to, the storage medium. In the alternative, the storage medium may be integral to the processor.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

The terminology used herein is for the purpose of describing particular aspects only and is not intended to be limiting of the aspects. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may comprise one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

While the foregoing disclosure shows illustrative aspects, it should be noted that various changes and modifications could be made herein without departing from the scope of the appended claims. The functions, steps or actions of the method claims in accordance with aspects described herein need not be performed in any particular order unless expressly stated otherwise. Furthermore, although elements may be described or claimed in the singular, the plural is contemplated unless limitation to the singular is explicitly stated.

What is claimed is:

1. A method of communication, comprising:
   receiving information to be encoded at a first wireless communication device;
   determining a code block size for the received information;
   determining a power-of-two block size that corresponds to a largest power-of-two integer that is less than the code block size;
   subtracting the power-of-two block size from the code block size to generate a difference value;
   selecting a rate matching for encoding the received information, wherein the selection is between repetition-based rate matching and puncture-based rate matching, and wherein the selection is based on the difference value;
   block encoding the received information using the selected rate matching; and
   transmitting, from the first wireless communication device over a communication channel to a second wireless communication device, a sequence based on the block encoded received information.

2. The method of claim 1, further comprising:
   calculating a fraction of the power-of-two block size; and
   comparing the difference value with the fraction,
   wherein the selection of the rate matching is further based on the comparison.

3. The method of claim 2, wherein the selection of the rate matching comprises:
   selecting repetition-based rate matching if the comparison indicates that the difference value is less than the fraction; or
   selecting puncture-based rate matching if the comparison indicates that the difference value is greater than or equal to the fraction.

4. The method of claim 1, wherein the selected rate matching is the puncture-based rate matching and the block encoding comprises:
   generating block coded data based on double the power-of-two block size; and
   puncturing bits of the generated block coded data.

5. The method of claim 4, wherein the puncturing of bits of the generated block coded data comprises puncturing a quantity of bits equal to a difference between double the power-of-two block size and the code block size.

6. The method of claim 1, wherein the block encoding comprises Polar coding.

7. A first wireless communication device, comprising:
   a memory; and
   a processor coupled to the memory,
   the processor and the memory configured to:
      receive information to be encoded;
      determine a code block size for the received information;
      determine a power-of-two block size that corresponds to a largest power-of-two integer that is less than the code block size;
      subtract the power-of-two block size from the code block size to generate a difference value;
      select a rate matching for encoding the received information, wherein the selection is between repetition-based rate matching and puncture-based rate matching, and wherein the selection is based on the difference value;
      block encode the received information using the selected rate matching; and
      transmit, from the first wireless communication device over a communication channel to a second wireless communication device, a signal-sequence based on the block encoded received information.

8. The device of claim 7, wherein the processor and the memory are further configured to:
   calculate a fraction of the power-of-two block size; and
   compare the difference value with the fraction,
   wherein the selection of the rate matching is further based on the comparison.

9. The device of claim 8, wherein the selection of the rate matching comprises:
  selection of repetition-based rate matching if the comparison indicates that the difference value is less than the fraction; or
  selection of puncture-based rate matching if the comparison indicates that the difference value is greater than or equal to the fraction.

10. The device of claim 7, wherein the selected rate matching is the puncture-based rate matching and the block encoding comprises:
  generation of block coded data based on double the power-of-two block size; and
  puncture of bits of the generated block coded data.

11. The device of claim 10, wherein the puncture of bits of the generated block coded data comprises puncture of a quantity of bits equal to a difference between double the power-of-two block size and the code block size.

12. The device of claim 7, wherein the block encoding comprises Polar coding.

13. A first wireless communication device, comprising:
  means for receiving information to be encoded;
  means for determining a code block size for the received information;
  means for determining a power-of-two block size that corresponds to a largest power-of-two integer that is less than the code block size;
  means for subtracting the power-of-two block size from the code block size to generate a difference value;
  means for selecting a rate matching for encoding the received information, wherein the selection is between repetition-based rate matching and puncture-based rate matching, and wherein the selection is based on the difference value;
  means for block encoding the received information using the selected rate matching; and
  means for transmitting, from the first wireless communication device over a communication channel to a second wireless communication device, a sequence based on the block encoded received information.

14. The device of claim 13, further comprising:
  means for calculating a fraction of the power-of-two block size; and
  means for comparing the difference value with the fraction,
  wherein the selection of the rate matching is further based on the comparison.

15. The device of claim 14, wherein the selection of the rate matching comprises:
  selection of repetition-based rate matching if the comparison indicates that the difference value is less than the fraction; or
  selection of puncture-based rate matching if the comparison indicates that the difference value is greater than or equal to the fraction.

16. The device of claim 13, wherein the selected rate matching is the puncture-based rate matching and the block encoding comprises:
  generation of block coded data based on double the power-of-two block size; and
  puncture of bits of the generated block coded data.

17. The device of claim 16, wherein a quantity of bits equal to a difference between double the power-of-two block size and the code block size is punctured in the generated block coded data.

18. The device of claim 13, wherein the block encoding comprises Polar coding.

19. A non-transitory computer-readable medium storing computer-executable code, including code to:
  receive information to be encoded at a first wireless communication device;
  determine a code block size for the received information;
  determine a power-of-two block size that corresponds to a largest power-of-two integer that is less than the code block size;
  subtract the power-of-two block size from the code block size to generate a difference value;
  select a rate matching for encoding the received information, wherein the selection is between repetition-based rate matching and puncture-based rate matching, and wherein the selection is based on the difference value;
  block encode the received information using the selected rate matching; and
  transmit, from the first wireless communication device over a communication channel to a second wireless communication device, a sequence based on the block encoded received information.

20. A method of communication, comprising:
  receiving information to be encoded at a first wireless communication device;
  determining a code block size for the received information;
  determining a power-of-two block size by identifying a largest power-of-two integer that is less than the code block size,
  subtracting the power-of-two block size from the code block size to generate a difference value;
  selecting repetition-based rate matching based on the difference value;
  block encoding the received information to generate first block coded data according to the power-of-two block size;
  generating a repetition pattern;
  obtaining coded bits based on the repetition pattern;
  generating second block coded data by adding the coded bits to the first block coded data; and
  transmitting, from the first wireless communication device over a communication channel to a second wireless communication device, a sequence based on the second block coded data.

21. The method of claim 20, wherein the generation of the repetition pattern comprises:
  generating a first repetition pattern; and
  generating a second repetition pattern based on a bit-reversal permutation of the first repetition pattern.

22. The method of claim 21, wherein the coded bits are obtained from locations indicated by the second repetition pattern.

23. The method of claim 20, wherein the repetition pattern consists of a quantity of bits corresponding to the code block size.

24. The method of claim 20, further comprising:
  determining a difference between the code block size and the power-of-two block size,
  wherein the generation of the repetition pattern comprises including, in the repetition pattern, a quantity of ones equal to the difference between the code block size and the power-of-two block size.

25. The method of claim 24, wherein the obtaining of the coded bits based on the repetition pattern comprises:
  obtaining a quantity of coded bits based on the difference between the code block size and the power-of-two block size.

26. The method of claim 20, wherein the block encoding comprises Polar coding.

27. A first wireless communication device, comprising:
a memory; and
a processor coupled to the memory,
the processor and the memory configured to:
receive information to be encoded;
determine a code block size for the received information;
determine a power-of-two block size by identifying a largest power-of-two integer that is less than the code block size;
subtract the power-of-two block size from the code block size to generate a difference value;
select repetition-based rate matching based on the difference value;
block encode the received information to generate first block coded data according to the power-of-two block size;
generate a repetition pattern;
obtain coded bits based on the repetition pattern;
generate second block coded data by adding the coded bits to the first block coded data; and
transmit, from the first wireless communication device over a communication channel to a second wireless communication device, a sequence based on the second block coded data.

28. The device of claim 27, wherein the generation of the repetition pattern comprises:
generation of a first repetition pattern; and
generation of a second repetition pattern based on a bit-reversal permutation of the first repetition pattern.

29. The device of claim 28, wherein the coded bits are obtained from locations indicated by the second repetition pattern.

30. The device of claim 27, wherein the repetition pattern consists of a quantity of bits corresponding to the code block size.

31. The device of claim 27, wherein:
the processor and the memory are further configured to determine a difference between the code block size and the power-of-two block size; and
the generation of the repetition pattern comprises including, in the repetition pattern, a quantity of ones equal to the difference between the code block size and the power-of-two block size.

32. The device of claim 31, wherein, to obtain the coded bits based on the repetition pattern, the processor and the memory are further configured to:
obtain a quantity of coded bits based on the difference between the code block size and the power-of-two block size.

33. The device of claim 27, wherein the block encoding comprises Polar coding.

34. A first wireless communication device, comprising:
means for receiving information to be encoded;
means for determining a code block size for the received information;
means for determining a power-of-two block size by identifying a largest power-of-two integer that is less than the code block size;
means for subtracting the power-of-two block size from the code block size to generate a difference value;
means for selecting repetition-based rate matching based on the difference value;
means for block encoding the received information to generate first block coded data according to the power-of-two block size;
means for generating a repetition pattern;
means for obtaining coded bits based on the repetition pattern;
means for generating second block coded data by adding the coded bits to the first block coded data; and
means for transmitting, from the first wireless communication device over a communication channel to a second wireless communication device, a sequence based on the second block coded data.

35. The device of claim 34, wherein the generation of the repetition pattern comprises:
generation of a first repetition pattern; and
generation of a second repetition pattern based on a bit-reversal permutation of the first repetition pattern.

36. The device of claim 35, wherein the coded bits are obtained from locations indicated by the second repetition pattern.

37. The device of claim 34, wherein the repetition pattern consists of a quantity of bits corresponding to the code block size.

38. The device of claim 34, further comprising:
means for determining a difference between the code block size and the power-of-two block size,
wherein the generation of the repetition pattern comprises including, in the repetition pattern, a quantity of ones equal to the difference between the code block size and the power-of-two block size.

39. The device of claim 38, wherein, to obtain the coded bits based on the repetition pattern, the means for obtaining is configured to:
obtain a quantity of coded bits based on the difference between the code block size and the power-of-two block size.

40. The device of claim 34, wherein the block encoding comprises Polar coding.

41. A non-transitory computer-readable medium storing computer-executable code, including code to:
receive information to be encoded at a first wireless communication device;
determine a code block size for the received information;
determine a power-of-two block size by identifying a largest power-of-two integer that is less than the code block size;
subtract the power-of-two block size from the code block size to generate a difference value;
select repetition-based rate matching based on the difference value;
block encode the received information to generate first block coded data according to the power-of-two block size;
generate a repetition pattern;
obtain coded bits based on the repetition pattern;
generate second block coded data by adding the coded bits to the first block coded data; and
transmit, from the first wireless communication device over a communication channel to a second wireless communication device, a sequence based on the second block coded data.

* * * * *